US012567910B2

(12) United States Patent
Meade et al.

(10) Patent No.: US 12,567,910 B2
(45) Date of Patent: *Mar. 3, 2026

(54) POOLED MEMORY SYSTEM ENABLED BY MONOLITHIC IN-PACKAGE OPTICAL I/O

(71) Applicant: Ayar Labs, Inc., Santa Clara, CA (US)

(72) Inventors: Roy Edward Meade, Lafayette, CA (US); Vladimir Stojanovic, Berkeley, CA (US); Chen Sun, Berkeley, CA (US); Mark Wade, Berkeley, CA (US); Hugo Saleh, Tuscaloosa, AL (US); Charles Wuischpard, Danville, CA (US)

(73) Assignee: Ayar Labs, Inc., San Jose, CA (US)

( * ) Notice: Subject to any disclaimer, the term of this patent is extended or adjusted under 35 U.S.C. 154(b) by 36 days.

This patent is subject to a terminal disclaimer.

(21) Appl. No.: 18/354,379

(22) Filed: Jul. 18, 2023

(65) Prior Publication Data

US 2023/0370170 A1 Nov. 16, 2023

Related U.S. Application Data

(63) Continuation of application No. 17/583,967, filed on Jan. 25, 2022, now Pat. No. 11,705,972, which is a
(Continued)

(51) Int. Cl.
*G11C 11/42* (2006.01)
*G02B 6/42* (2006.01)
(Continued)

(52) U.S. Cl.
CPC ........... *H04B 10/80* (2013.01); *G02B 6/4249* (2013.01); *G02B 6/4274* (2013.01); *G11C 5/04* (2013.01);
(Continued)

(58) Field of Classification Search
CPC .... H04B 10/80; H04B 10/516; G02B 6/4249; G02B 6/4274; G11C 5/04; G11C 5/06; G11C 5/141; G11C 11/42
See application file for complete search history.

(56) References Cited

U.S. PATENT DOCUMENTS 9,547,553 B1 * 1/2017 Khermosh .............. G06F 11/10
11,233,580 B2 * 1/2022 Meade ................... G11C 11/42
(Continued)

*Primary Examiner* — Min Huang
(74) *Attorney, Agent, or Firm* — Penilla IP, APC

(57) ABSTRACT

A computer memory system includes an electro-optical chip, an electrical fanout chip electrically connected to an electrical interface of the electro-optical chip, and at least one dual in-line memory module (DIMM) slot electrically connected to the electrical fanout chip. A photonic interface of the electro-optical chip is optically connected to an optical link. The electro-optical chip includes at least one optical macro that converts outgoing electrical data signals into outgoing optical data signals for transmission through the optical link. The optical macro also converts incoming optical data signals from the optical link into incoming electrical data signals and transmits the incoming electrical data signals to the electrical fanout chip. The electrical fanout chip directs bi-directional electrical data communication between the electro-optical chip and a dynamic random access memory (DRAM) DIMM corresponding to the at least one DIMM slot.

20 Claims, 23 Drawing Sheets

Related U.S. Application Data continuation of application No. 17/175,678, filed on Feb. 14, 2021, now Pat. No. 11,233,580.

(60) Provisional application No. 63/127,116, filed on Dec. 17, 2020, provisional application No. 62/977,047, filed on Feb. 14, 2020.

(51) Int. Cl.

| | |
|---|---|
| *G11C 5/04* | (2006.01) |
| *G11C 5/06* | (2006.01) |
| *G11C 5/14* | (2006.01) |
| *H04B 10/516* | (2013.01) |
| *H04B 10/80* | (2013.01) |

(52) U.S. Cl.
CPC ................ *G11C 5/06* (2013.01); *G11C 5/141* (2013.01); *G11C 11/42* (2013.01); *H04B 10/516* (2013.01)

(56)                       References Cited

U.S. PATENT DOCUMENTS

| | | | | |
|---|---|---|---|---|
| 11,705,972 B2 * | 7/2023 | Meade | ..................... | G11C 5/04 |
| | | | | 365/244 |
| 2014/0016404 A1 * | 1/2014 | Kim | ..................... | G11C 11/165 |
| | | | | 365/158 |
| 2019/0335252 A1 * | 10/2019 | Ryan | ................. | H04B 10/0793 |
| 2020/0355880 A1 * | 11/2020 | Wright | ................ | G02B 6/4215 |

* cited by examiner 305    301    302, 311

307

303

1200

| Electrical Interface (AIB) 1201 | Glue Logic 1207 | TeraPHY Macro 1 1205-1 | Optical Fiber Coupler Array & Photonic Interface 1203 |
|---|---|---|---|
| | | TeraPHY Macro 2 1205-2 | |
| | | TeraPHY Macro 3 1205-3 | |
| | | TeraPHY Macro 4 1205-4 | |
| | | TeraPHY Macro 5 1205-5 | |
| | | TeraPHY Macro 6 1205-6 | |
| | | ⋮ | |
| | | TeraPHY Macro N 1205-N | |

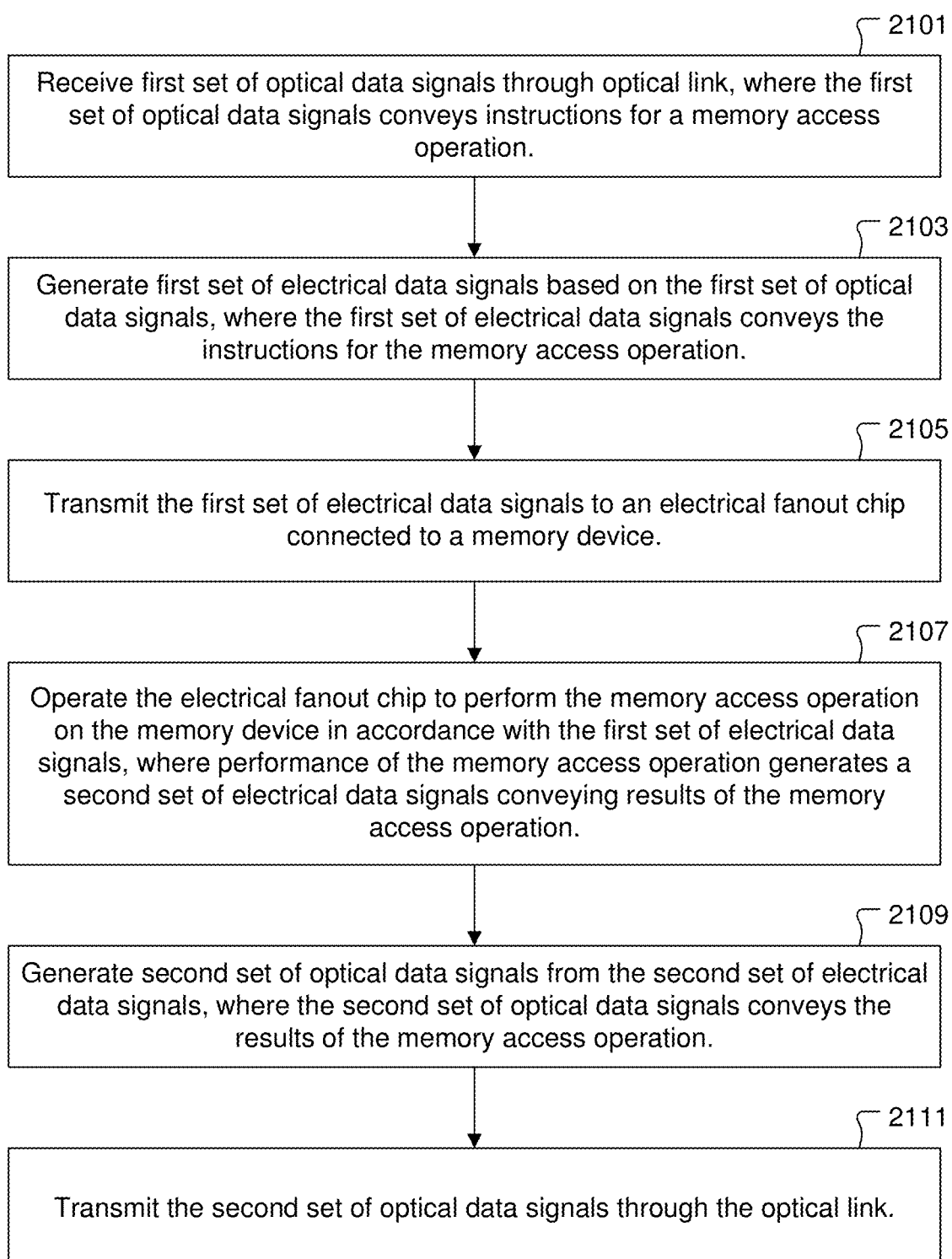

2101

Receive first set of optical data signals through optical link, where the first set of optical data signals conveys instructions for a memory access operation.

2103

Generate first set of electrical data signals based on the first set of optical data signals, where the first set of electrical data signals conveys the instructions for the memory access operation.

2105

Transmit the first set of electrical data signals to an electrical fanout chip connected to a memory device.

2107

Operate the electrical fanout chip to perform the memory access operation on the memory device in accordance with the first set of electrical data signals, where performance of the memory access operation generates a second set of electrical data signals conveying results of the memory access operation.

2109

Generate second set of optical data signals from the second set of electrical data signals, where the second set of optical data signals conveys the results of the memory access operation.

2111

Transmit the second set of optical data signals through the optical link.

Fig. 21

POOLED MEMORY SYSTEM ENABLED BY MONOLITHIC IN-PACKAGE OPTICAL I/O

CLAIM OF PRIORITY

This application is a continuation application under 35 U.S.C. 120 of prior U.S. application Ser. No. 17/583,967, filed Jan. 25, 2022, issued as U.S. Pat. No. 11,705,972, on Jul. 18, 2023, which is a continuation application under 35 U.S.C. 120 of prior U.S. application Ser. No. 17/175,678, filed Feb. 14, 2021, issued as U.S. Pat. No. 11,233,580, on Jan. 25, 2022, which claims priority under 35 U.S.C. 119 (e) to each of 1) U.S. Provisional Patent Application No. 62/977,047, filed on Feb. 14, 2020, and 2) U.S. Provisional Patent Application No. 63/127,116, filed on Dec. 17, 2020. The disclosure of each above-identified patent application is incorporated herein by reference in its entirety for all purposes.

BACKGROUND

New workloads underpinned by a surge of machine learning, visual computing and graphic analytics applications have driven compute systems toward hardware specialization. A number of accelerator systems on chip have been designed in recent years, starting from the evolution of graphics processing units (GPUs) to even more explicitly specialized systems-on-chip (SoC). These specialized chips enable high-throughput computing for target applications and require high-bandwidth, low-latency access to memory. High-bandwidth memory (HBM) integration in the same package has served to satisfy this need, but at limited capacity of the memory stacks. Currently, state of the art SoCs have up to four HBM interfaces running out of both the chip shoreline and package real-estate to host additional HBM stacks and interfaces, with total in-package memory being limited to just under 100 gigabytes (GB). As algorithms and applications are rapidly scaling toward much larger data footprints, the performance scaling of these nodes is critically affected by the need to access larger memory pools. Currently, the connection would be through a Peripheral Component Interconnect express (PCIe) bus or switch to the local Dynamic Random Access Memory (DRAM) of the host Central Processing Unit (CPU). A new technology is needed to enable SoCs to access off-package pools of memory at the bandwidth-density, latency, and energy-cost of in-package interconnect. It is within this context that the present invention arises.

SUMMARY

In an example embodiment, a remote memory system is disclosed. The remote memory system includes a substrate of a multi-chip package. The remote memory system also includes an integrated circuit chip connected to the substrate. The integrated circuit chip includes a high-bandwidth memory interface. The remote memory system also includes an electro-optical chip connected to the substrate. The electro-optical chip has an electrical interface electrically connected to the high-bandwidth memory interface of the integrated circuit chip. The electro-optical chip includes a photonic interface configured to optically connect with an optical link. The electro-optical chip includes at least one optical macro. Each of the at least one optical macro is configured to convert outgoing electrical data signals received through the electrical interface from the high-bandwidth interface into outgoing optical data signals. Each of the at least one optical macro is configured to transmit the outgoing optical data signals through the photonic interface to the optical link. Each of the at least one optical macro is configured to convert incoming optical data signals received through the photonic interface from the optical link into incoming electrical data signals. Each of the at least one optical macro is configured to transmit the incoming electrical data signals through the electrical interface to the high-bandwidth memory interface.

In an example embodiment, a method is disclosed for operating a remote memory system. The method includes generating a first set of electrical data signals that convey instructions for a memory access operation. The method also includes generating optical data signals based on the first set of electrical data signals. The optical data signals convey the instructions for the memory access operation. The method also includes transmitting the optical data signals over an optical link to a remote memory device. The method also includes generating a second set of electrical data signals at the remote memory device from the optical data signals, the second set of electrical data signals conveying the instructions for the memory access operation. The method also includes using the second set of electrical data signals to perform the memory access operation at the remote memory device.

In an example embodiment, a method is disclosed for configuring a remote memory system. The method includes having an integrated circuit chip electrically connected to a first electro-optical chip on a first multi-chip package. The method also includes optically connecting the first electro-optical chip to a first end of an optical link. The method also includes optically connecting a second electro-optical chip to a second end of the optical link. The second electro-optical chip is electrically connected to a memory device on a second multi-chip package that is physically separate from the first multi-chip package.

In an example embodiment, a computer memory system is disclosed. The computer memory system includes an electro-optical chip that includes an electrical interface and a photonic interface. The photonic interface is configured to optically connect with an optical link. The electro-optical chip also includes at least one optical macro. Each of the at least one optical macro is configured to convert outgoing electrical data signals received through the electrical interface into outgoing optical data signals. Each of the at least one optical macro is configured to transmit the outgoing optical data signals through the photonic interface to the optical link. Each of the at least one optical macro is configured to convert incoming optical data signals received through the photonic interface from the optical link into incoming electrical data signals. Each of the at least one optical macro is configured to transmit the incoming electrical data signals through the electrical interface. The computer memory system also includes an electrical fanout chip electrically connected to the electrical interface of the electro-optical chip. The computer memory system also includes at least one dual in-line memory module (DIMM) slot electrically connected to the electrical fanout chip. Each of the at least one DIMM slot configured to receive a corresponding dynamic random access memory (DRAM) DIMM. The electrical fanout chip is configured to direct bi-directional electrical data communication between the electro-optical chip and each DRAM DIMM corresponding to the at least one dual in-line memory module slot.

In an example embodiment, a method is disclosed for operating a computer memory system. The method includes receiving a first set of optical data signals through an optical link. The first set of optical data signals conveys instructions for a memory access operation. The method also includes generating a first set of electrical data signals based on the first set of optical data signals. The first set of electrical data signals conveys the instructions for the memory access operation. The method also includes transmitting the first set of electrical data signals to an electrical fanout chip connected to a memory device. The method also includes operating the electrical fanout chip to perform the memory access operation on the memory device in accordance with the first set of electrical data signals. Performance of the memory access operation generates a second set of electrical data signals that convey results of the memory access operation. The method also includes generating a second set of optical data signals from the second set of electrical data signals. The second set of optical data signals convey the results of the memory access operation. The method also includes transmitting the second set of optical data signals through the optical link.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 21 shows a flowchart of a method for operating a computer memory system, in accordance with some embodiments.

DETAILED DESCRIPTION

Figure 1:
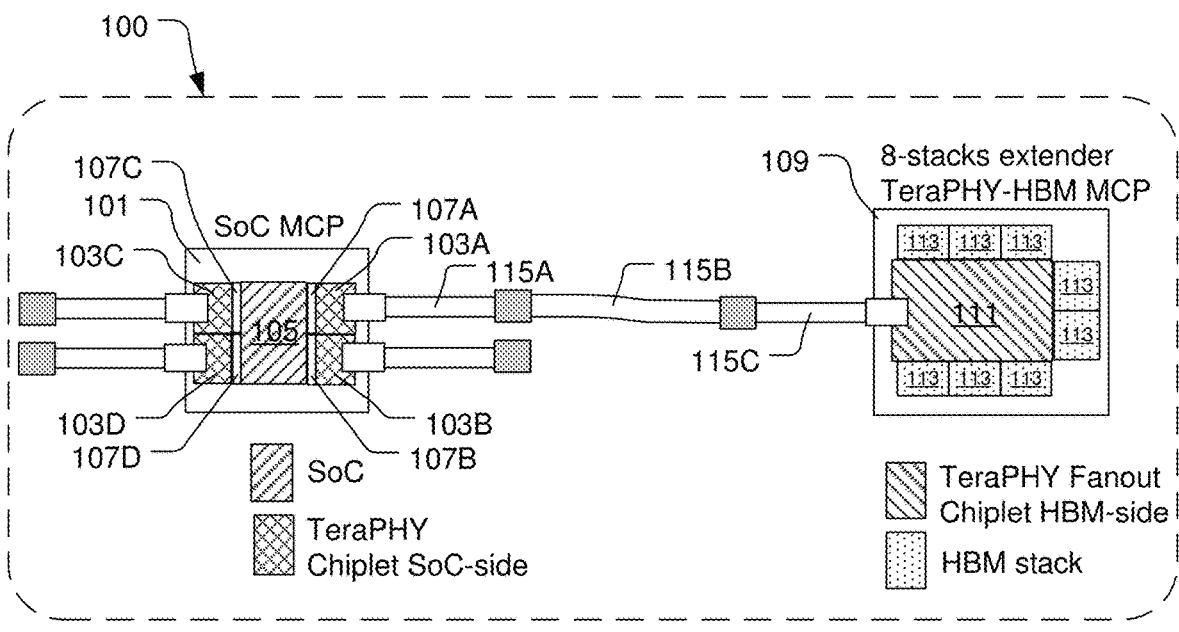
FIG. 1 shows an example MIPO I/O-enabled HBM extender system, in accordance with some embodiments.

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

Embodiments are disclosed herein for computing systems that include one or more semiconductor chip(s)/die connected in optical data communication to an external, off-package pool of memory at a bandwidth-density, latency, and energy-cost that meets or exceeds extant requirements of in-package electrical interconnect between semiconductor chip(s)/die and memory devices. In various embodiments, Monolithic In-Package Optical Input and Output (MIPO I/O) chiplets are implemented to establish optical data communication between the one or more semiconductor chip(s)/die and the external, off-package pool of memory. The MIPO I/O chiplets provide for translation/conversion of data communication from the electrical domain to the optical domain, and vice-versa. In this manner, the MIPO I/O chiplets provide for translation/conversion of memory access signals as generated within the electrical domain at the one or more semiconductor chip(s)/die to corresponding optical signals for transmission within the optical domain. Use of multiple MIPO I/O chiplets for transmission and reception of optical signals over an optical link also provides for transmission of the memory access signals within the optical domain to the external, off-package pool of memory. Also, the MPIP I/O chiplet provides for translation/conversion of the memory access signals within the optical domain back to the electrical domain at the external, off-package pool of memory to enable execution of memory access operations conveyed by the memory access signals in the electrical domain at the external, off-package pool of memory. The MIPO I/O chiplets also provide for data communication in the direction going from the external, off-package pool of memory back to the one or more semiconductor chip(s)/die, with MIPO I/O chiplets providing for translation/conversion of data communication signals from the electrical domain to the optical domain at the external, off-package pool of memory, and with the MIPO I/O chiplets providing for translation/conversion of data communication signals from the optical domain to the electrical domain at the one or more semiconductor chip(s)/die. In some embodiments, the external, off-package pool of memory is implemented using HBM stacks. In some embodiments, the external, off-package pool of memory is implemented using DRAM modules. Use of the MIPO I/O chiplets enables the one or more semiconductor chip(s)/die to access more HBM capacity and/or DRAM module capacity at the same or better bandwidth-density, latency, and energy-cost than would be available/possible with the semiconductor chip(s)/die and HBM stacks and/or DRAM modules implemented together in a same package.

In various embodiments the MIPO I/O chiplet referred to herein includes electrical devices, optical devices, electro-optical devices, and/or thermo-optical devices, and corresponding electrical and optical circuitry. The MIPO I/O chiplet referred to herein corresponds to a photonic-equipped chip/die to which one or more optical fiber(s) is/are connected to provide for transmission of light into and/or out of the semiconductor chip/die. The coupling of an optical fiber to a semiconductor chip/die is referred to as fiber-to-chip coupling. In some embodiments, the MIPO I/O chiplet referred to herein includes integrated optical fiber alignment structures, such as v-grooves and/or channels, among others, configured to facilitate attachment of optical fibers to the MIPO I/O chiplet. In some semiconductor die packaging embodiments in which the MIPO I/O chiplet is packaged, in-package optical interconnect relies on 2.5D or 2.1D interposer-type packaging technology. Also, in some semiconductor die packaging embodiments in which the MIPO I/O chiplet is packaged, either a 3D packaging approach, e.g., die stacking, or a wire-bonding approach is utilized.

The term "light" as used herein refers to electromagnetic radiation within a portion of the electromagnetic spectrum that is usable by optical data communication systems. The term "wavelength," as used herein, refers to the wavelength of electromagnetic radiation. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum.

FIG. 1 shows an example MIPO I/O-enabled HBM extender system 100, in accordance with some embodiments. In the example HBM extender system 100, an SoC Multi-Chip Package (MCP) 101 hosts MIPO I/O chiplets 103A, 103B, 103C, and 103D. It should be understood that the four MIPO I/O chiplets 103A-103D are provided by way of example. In various embodiments, the SoC MCP 101 hosts either less than four MIPO I/O chiplets or more than four MIPO I/O chiplets. In some embodiments, each of the MIPO I/O chiplets 103A, 103B, 103C, 103D is a TeraPHY MIPO I/O chiplet provided by Ayar Labs, Inc. The MIPO I/O chiplets 103A, 103B, 103C, 103D are attached to HBM interfaces 107A, 107B, 107C, 107D, respectively, of an SoC 105 on the SoC MCP 101. In some embodiments, the SoC MCP 101 includes multiple SoC's 105, with each SoC 105 having one or more HBM interfaces connected to corresponding MIPO I/O chiplets. The HBM interfaces 107A, 107B, 107C, 107D of the SoC 105 transmit and receive data off-package through the corresponding MIPO I/O chiplet 103A-103D to a dedicated HBM card 109.

The SoC MCP 101 and the HBM card 109 are connected to each other through the optical domain for bi-directional data communication. In some embodiments, optical fibers are used to connect the SoC MCP 101 and the HBM card 109 in the optical domain for bi-directional data communication. For example, in some embodiments, optical fiber arrays 115A, 115B, 115C are used to optically connect the MIPO I/O chiplet 103A of the SoC MCP 101 to the optical fanout chiplet 111 of the HBM card 109. In some embodiments, a lightwave circuit (such as a planar lightwave circuit (PLC) or optical waveguides implemented within an interposer substrate, among others) is used to connect the SoC MCP 101 and the HBM card 109 in the optical domain for bi-directional data communication. It should be understood that each of the MIPO I/O chiplet 103A-103D and the optical fanout chiplet 111 exposes a respective optical interface, and the exposed optical interfaces of a given one of the MIPO I/O chiplets 103A-103D and the optical fanout chiplet 111 are optically connected to each other to enable bi-directional data communication between the given MIPO I/O chiplet 103A-103D and the optical fanout chiplet 111.

In this manner, the MIPO I/O chiplet 103A-103D provides an optical interface for the SoC MCP 101. The MIPO I/O chiplet 103A-103D converts digital data received in the electrical domain through the corresponding HBM interface 107A-107D into an optical data stream (into a stream of modulated light that conveys the digital data) and transmits the optical data stream over an optical connection provided by optical fiber arrays 115A, 115B, 115C to an optical fanout chiplet 111 of the corresponding HBM card 109. Also, in the reverse data communication direction, the MIPO I/O chiplet 103A-103D receives digital data in the optical domain (as streams of modulated light) through the optical fiber arrays 115A, 115B, 115C from the optical fanout chiplet 111 of the corresponding HBM card 109. The MIPO I/O chiplet 103A-103D converts the digital data received in the optical domain from the HBM card 109 to the electrical domain by de-modulating the streams of modulated light that are received from the optical fanout chiplet 111 of the corresponding HBM card 109. The MIPO I/O chiplet 103A-103D directs the electrical signals conveying the digital data, as received in optical form from the HBM card 109, through the corresponding HBM interface 107A-107D to the SoC 105.

In some embodiments, the HBM card 109 is an MCP that includes the optical fanout chiplet 111 and a number of HBM stacks 113. In some embodiments, the optical fanout chiplet 111 is a TeraPHY Fanout Chiplet by Ayar Labs, Inc. The optical fanout chiplet 111 provides an optical interface for the HBM card 109. The optical fanout chiplet 111 converts digital data received in optical form (e.g., as streams of modulated light) from the SoC MCP 101 into corresponding electrical signals. The optical fanout chiplet 111 then directs the electrical signals conveying the digital data received that was received in optical form to one or more of the HBM stacks 113, as appropriate. In this manner, the optical fanout chiplet 111 functions to provide the optical interface of the HBM card 109 and fan out the optical interface of the HBM card 109 through the electrical domain to each of the number of HBM stacks 113. Also, in the reverse data communication direction, the optical fanout chiplet 111 converts digital data obtained (read) from the HBM stacks 113 into optical data streams (into streams of modulated light that convey the obtained/read digital data) and transmits the optical data streams to the corresponding MIPO I/O chiplet 103A-103D on the SoC MCP 101.

To illustrate an advantage of having the MIPO I/O-enabled HBM extender system 100 of FIG. 1, consider a contrary example in which without the MIPO I/O-enabled HBM extender system 100 is not implemented and each of the HBM interfaces 107A, 107B, 107C, 107D of the SoC MCP 101 is electrically interfaced with a respective 24 GB HBM stack on-board the SoC MCP 101. In this contrary example, the SoC MCP 101 has an in-package memory footprint of 96 GB. In contrast, by way of example, implementation of the example MIPO I/O-enabled HBM extender system 100 of FIG. 1 provides for each of the four HBM interfaces 107A, 107B, 107C, 107D of the SoC MCP 101 to be interfaced with a corresponding one of four HBM cards 109, where each HBM card 109 has eight HBM stacks 113 of 24 GB per HBM stack 113, thereby providing the SoC MCP 101 with a memory footprint of 768 GB (4 HBM cards*8 HBM stacks per HBM card*24 GB per HBM stack) at 1.6 terabytes per second (TB/s) total memory bandwidth. Therefore, in some embodiments, the MIPO I/O-enabled HBM extender system 100 extends the memory footprint of the SoC MCP 101 from 96 GB to 768 GB of high-bandwidth memory at 1.6 TB/s throughput. It should be understood that the above-mentioned SoC MCP 101 example is one of many possible SoC MCP 101 memory footprint configurations. In other embodiments, the number of HBM interfaces (e.g., 107A-107D) on the SoC MCP 101 can be more or less than four, and/or the number of HBM stacks 113 per HBM card 109 can be more or less than eight, and/or the storage capacity of each HBM stack 113 can be more or less than 24 GB, so as to provide the SoC MCP 101 with a memory footprint that is either less than or greater than 768 GB. Also, in various embodiments, the data throughput rate of the SoC MCP 101 can be either less than or greater than 1.6 TB/s. However, it should be understood that implementation of the MIPO I/O-enabled HBM extender system 100 of FIG. 1 frees the memory footprint of the SoC MCP 101 from on-board physical constraints of the SoC MCP 101, and leverages the high data communication bandwidth and speed provided by the optical interface between the SoC MCP 101 and the HBM card 109 to meet or exceed data throughput rates that are achievable with direct HBM stack 113 implementation onboard the SoC MCP 101.

Figure 2A:
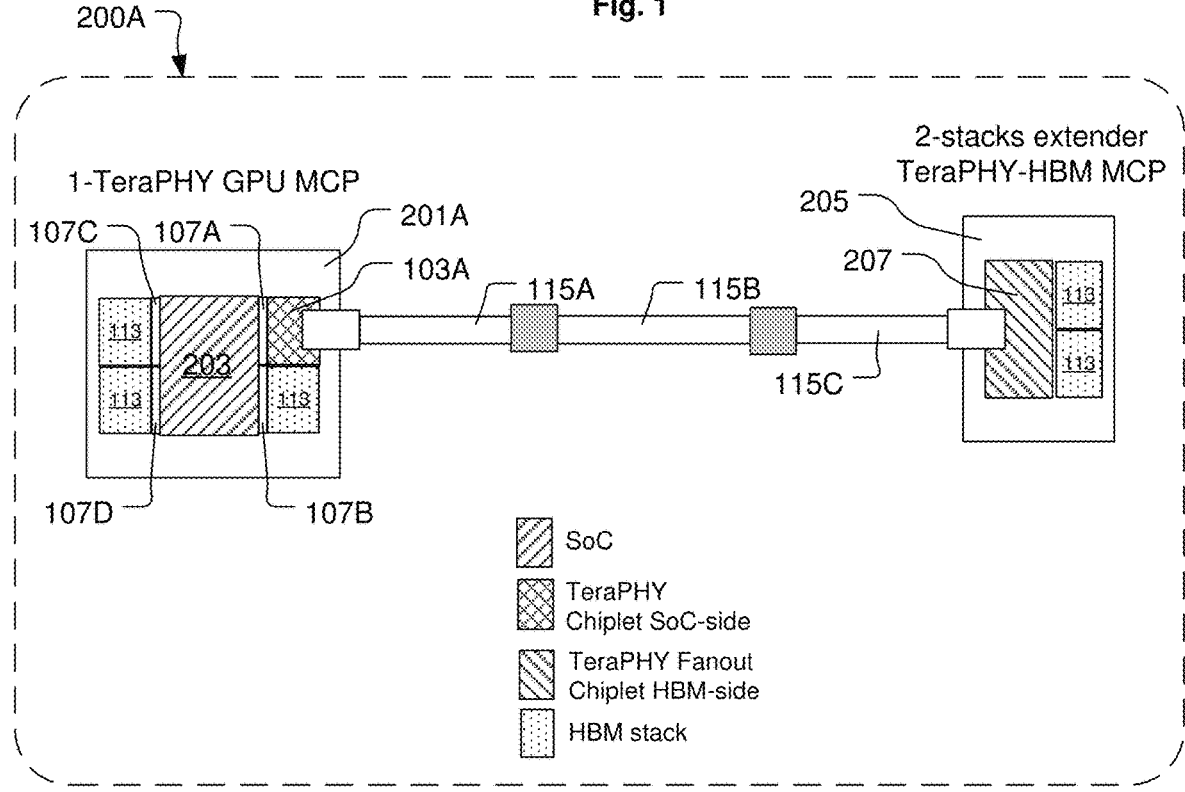
FIG. 2A shows an MIPO I/O-enabled HBM extender system, in accordance with some embodiments.

In various embodiments, different ratios of HBM stacks 113 to SoC MCP's 101 can be implemented. FIGS. 2A, 2B, 2C, and 2D show some examples implementations of different ratios of HBM stacks 113 to SoC MCP's 101. FIG. 2A shows an MIPO I/O-enabled HBM extender system 200A, in accordance with some embodiments. The MIPO I/O-enabled HBM extender system 200A includes an SoC MCP 201A optically connected to an HBM card 205 through optical fiber arrays 115A, 115B, 115C. The SoC MCP 201A includes the MIPO I/O chiplet 103A electrically connected to the HBM interface 107A of a GPU 203. The MIPO I/O chiplet 103A is the same as described with regard to FIG. 1. The MIPO I/O chiplet 103A has an optical interface that is optically connected to an optical interface of an optical fanout chiplet 207 of the HBM card 205 in order to extend the memory of the SoC MCP 201A. The optical fanout chiplet 207 is like the optical fanout chiplet 111 described with regard to FIG. 1, except that the optical fanout chiplet 207 is configured to electrically interface with two HBM stacks 113 onboard the HBM card 205. The SoC MCP 201A also has each of the HBM interfaces 107B, 107C, and 107D of the GPU 203 connected to a respective HBM stack 113 onboard the SoC MCP 201A. It should be understood that in other embodiments, the GPU 203 can be replaced with essentially any type of computer chip installed on the SoC MCP 201A. In the example of FIG. 2A, the HBM card 205 includes two HBM stacks 113 to which the optical fanout chiplet 207 is connected.

In some embodiments, the HBM card 205 complies with the HBM2e standard by JEDEC (Joint Electron Device Engineering Council). In these embodiments, the HBM card 205 includes two HBM stacks 113, where each HBM stack is a half-stack having 4 or 6 die in order to fit the existing HBM2e standard. It should be understood that in various embodiments the HBM card 205 is configured to comply with essentially any of one or more HBM industry standards. Also, in some embodiments, a memory controller on the GPU 203 (or substituted computer chip) is modified to handle extra memory address bits for the remote HBM stack fanout provided by the HBM card 205, thereby exercising a memory capacity expansion for the SoC MCP 201A.

Figure 2B:
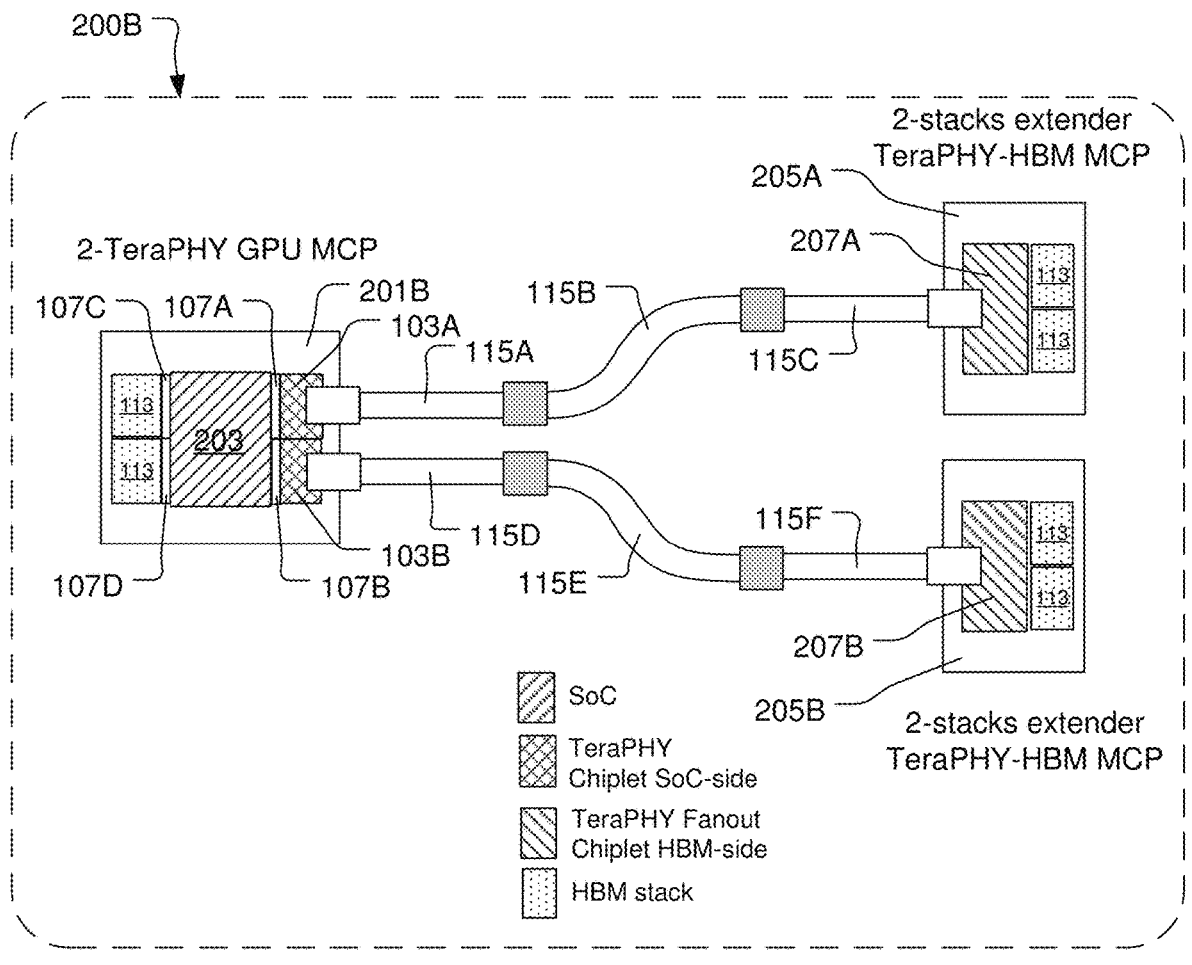
FIG. 2B shows an MIPO I/O-enabled HBM extender system, in accordance with some embodiments.

FIG. 2B shows an MIPO I/O-enabled HBM extender system 200B, in accordance with some embodiments. The MIPO I/O-enabled HBM extender system 200B includes an SoC MCP 201B optically connected to two HBM cards 205A and 205B to extend the memory of the SoC MCP 201B. The SoC MCP 201B is optically connected to the HBM card 205A through optical fiber arrays 115A, 115B, 115C. The SoC MCP 201B is optically connected to the HBM card 205B through optical fiber arrays 115D, 115E, 115F. The SoC MCP 201B includes two MIPO I/O chiplets 103A and 103B that are respectively connected to two HBM interfaces 107A and 107B of the GPU 203. The MIPO I/O chiplets 103A and 103B are the same as described with regard to FIG. 1. The MIPO I/O chiplet 103A has an optical interface that is optically connected through the optical fiber arrays 115A, 115B, 115C to an optical interface of an optical fanout chiplet 207A of the HBM card 205A that includes two HBM stacks 113, in order to extend the memory of the SoC MCP 201B. The MIPO I/O chiplet 103B has an optical interface that is optically connected through the optical fiber arrays 115D, 115E, 115F to an optical interface of an optical fanout chiplet 207B of the HBM card 205B that includes two HBM stacks 113, in order to extend the memory of the SoC MCP 201B. Each of the optical fanout chiplets 207A and 207B is like the optical fanout chiplet 111 described with regard to FIG. 1, except that each of the optical fanout chiplets 207A and 207B is configured to electrically interface with the two HBM stacks 113 onboard the HBM cards 205A and 205B, respectively. The SoC MCP 201B also has each of the HBM interfaces 107C and 107D of the GPU 203 connected to a respective HBM stack 113 onboard the SoC MCP 201B. It should be understood that in other embodiments, the GPU 203 can be replaced with essentially any type of computer chip installed on the SoC MCP 201B.

In some embodiments, each of the HBM cards 205A and 205B complies with the HBM2e standard. In these embodiments, each of the HBM cards 205A and 205B includes two HBM stacks 113, where each HBM stack is a half-stack having 4 or 6 die in order to fit the existing HBM2e standard. It should be understood that in various embodiments each of the HBM cards 205A and 205B is configured to comply with essentially any of one or more HBM industry standards. Also, in some embodiments, a memory controller on the GPU 203 (or substituted computer chip) is modified to handle extra memory address bits for the remote HBM stack fanout provided by the two HBM cards 205A and 205B, thereby exercising a memory capacity expansion for the SoC MCP 201B.

Figure 2C:
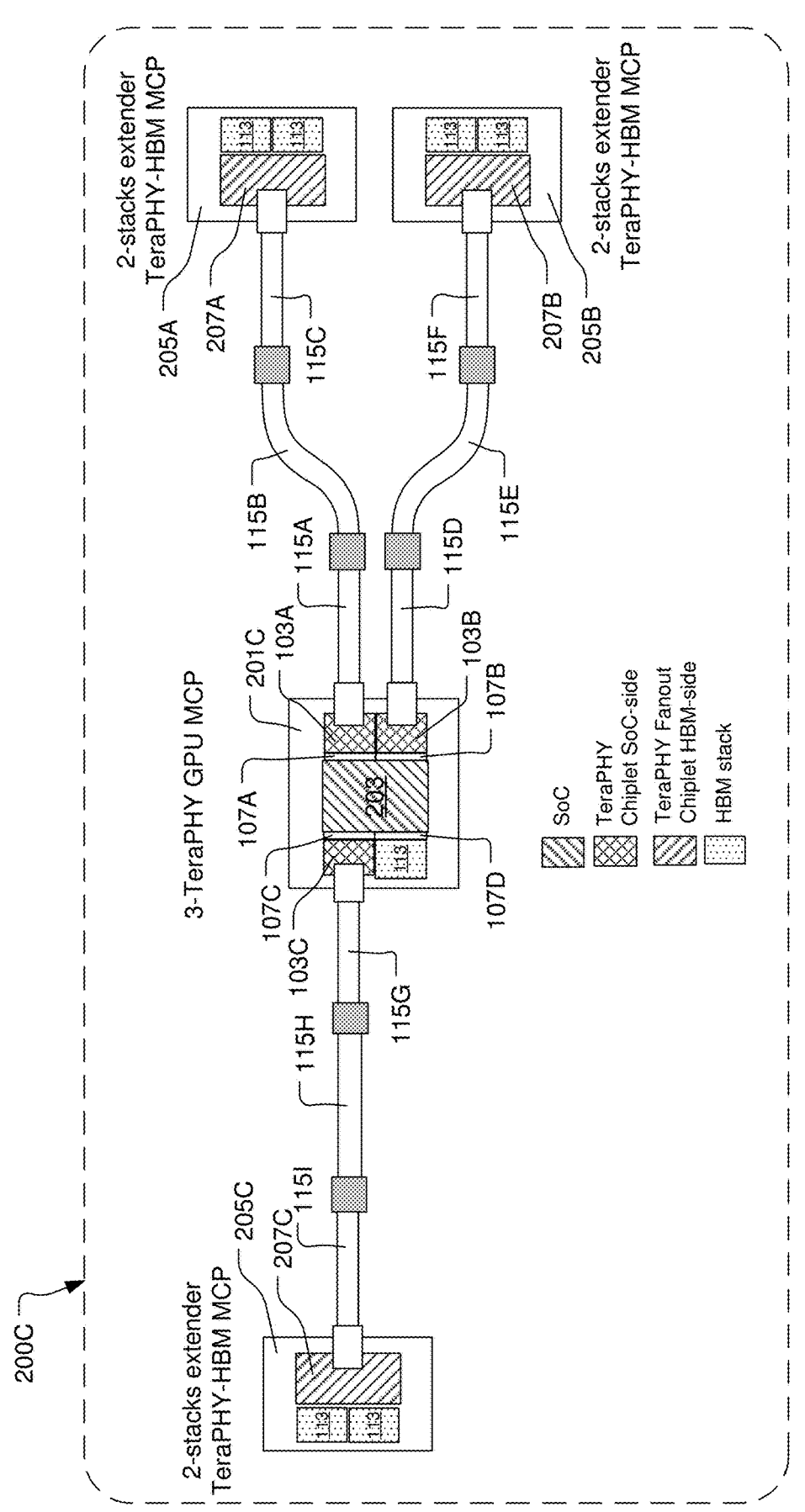
FIG. 2C shows an MIPO I/O-enabled HBM extender system, in accordance with some embodiments.

FIG. 2C shows an MIPO I/O-enabled HBM extender system 200C, in accordance with some embodiments. The MIPO I/O-enabled HBM extender system 200C includes an SoC MCP 201C optically connected to three HBM cards 205A, 205B, 205C to extend the memory of the SoC MCP 201C. The SoC MCP 201C includes the MIPO I/O chiplet 103A optically connected to the HBM card 205A through optical fiber arrays 115A, 115B, 115C. The SoC MCP 201C also includes the MIPO I/O chiplet 103B optically connected to the HBM card 205B through optical fiber arrays 115D, 115E, 115F. The MIPO I/O chiplets 103A and 103B and the HBM cards 205 and 205B are the same as described with regard to FIG. 2B. In the SoC MCP 201C, the MIPO I/O chiplet 103A is connected to the HBM interface 107A of the GPU 203. Also, the MIPO I/O chiplet 103B is connected to the HBM interface 107B of the GPU 203. The optical interface of the MIPO I/O chiplet 103A is optically connected to the optical interface of the optical fanout chiplet 207A of the HBM card 205A. Also, the optical interface of the MIPO I/O chiplet 103B is optically connected to the optical interface of the optical fanout chiplet 207B of the HBM card 205B. The HBM card 205A includes two HBM stacks 113 to which the optical fanout chiplet 207A is connected. The HBM card 205B includes two HBM stacks 113 to which the optical fanout chiplet 207B is connected.

The SoC MCP 201C also includes the MIPO I/O chiplet 103C electrically connected to the HBM interface 107C of the GPU 203. The optical interface of the MIPO I/O chiplet 103C is optically connected through optical fiber arrays 115G, 115H, 115I to an optical interface of an optical fanout chiplet 207C of an HBM card 205C that includes two HBM stacks 113, in order to extend the memory of the SoC MCP 201C. The MIPO I/O chiplets 103A, 103B, and 103C are the same as described with regard to FIG. 1. Each of the optical fanout chiplets 207A, 207B, and 207C is like the optical fanout chiplet 111 described with regard to FIG. 1, except that each of the optical fanout chiplets 207A, 207B, and 207C is configured to electrically interface with the two HBM stacks 113 onboard the HBM cards 205A, 205B, and 205C, respectively. The SoC MCP 201C also has the HBM interface 107D of the GPU 203 connected to an HBM stack 113 onboard the SoC MCP 201C. It should be understood that in other embodiments, the GPU 203 can be replaced with essentially any type of computer chip installed on the SoC MCP 201C.

In some embodiments, each of the HBM cards 205A, 205B, and 205C complies with the HBM2e standard. In these embodiments, each of the HBM cards 205A, 205B, and 205C includes two HBM stacks 113, where each HBM stack 113 is a half-stack having 4 or 6 die in order to fit the existing HBM2e standard. It should be understood that in various embodiments each of the HBM cards 205A, 205B, and 205C is configured to comply with essentially any of one or more HBM industry standards. Also, in some embodiments, a memory controller on the GPU 203 (or substituted computer chip) is modified to handle extra memory address bits for the remote HBM stack fanout provided by the three HBM cards 205A, 205B, and 205C, thereby exercising a memory capacity expansion for the SoC MCP 201C.

Figure 2D:
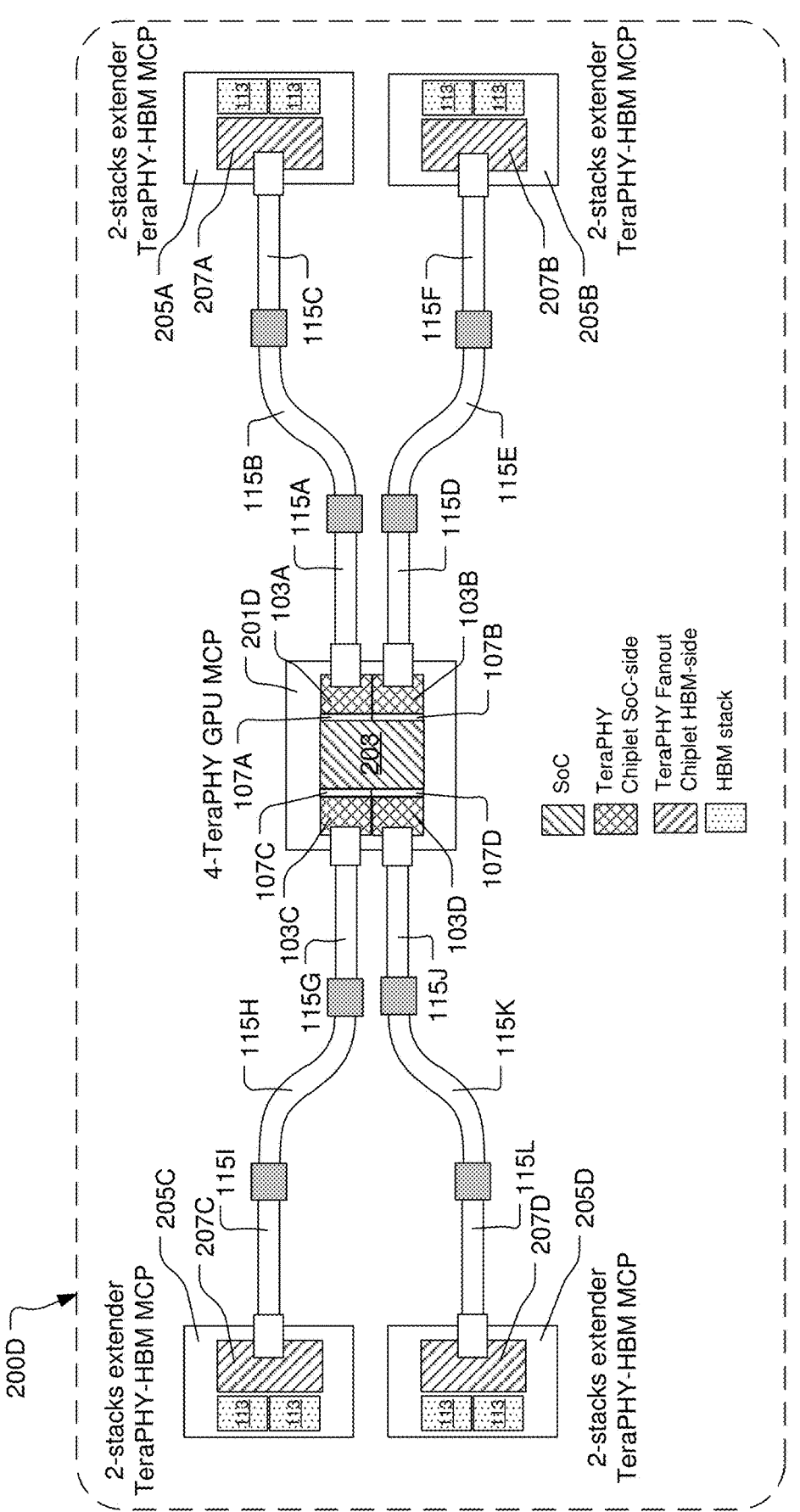
FIG. 2D shows an MIPO I/O-enabled HBM extender system, in accordance with some embodiments.

FIG. 2D shows an MIPO I/O-enabled HBM extender system 200D, in accordance with some embodiments. The MIPO I/O-enabled HBM extender system 200D includes an SoC MCP 201D optically connected to four HBM cards 205A, 205B, 205C, and 205D to extend the memory of the SoC MCP 201D. The SoC MCP 201D includes the MIPO I/O chiplet 103A optically connected to the HBM card 205A through optical fiber arrays 115A, 115B, 115C. The SoC MCP 201D also includes the MIPO I/O chiplet 103B optically connected to the HBM card 205B through optical fiber arrays 115D, 115E, 115F. The SoC MCP 201D also includes the MIPO I/O chiplet 103C optically connected to the HBM card 205C through optical fiber arrays 115G, 115H, 115I. The MIPO I/O chiplets 103A, 103B, and 103C, and the HBM cards 205A, 205B, and 205C are the same as described with regard to FIG. 2C. In the SoC MCP 201D, the MIPO I/O chiplet 103A is connected to the HBM interface 107A of the GPU 203. Also, the MIPO I/O chiplet 103B is connected to the HBM interface 107B of the GPU 203. Also, the MIPO I/O chiplet 103C is connected to the HBM interface 107C of the GPU 203. The optical interface of the MIPO I/O chiplet 103A is optically connected to the optical interface of the optical fanout chiplet 207A of the HBM card 205A. Also, the optical interface of the MIPO I/O chiplet 103B is optically connected to the optical interface of the optical fanout chiplet 207B of the HBM card 205B. Also, the optical interface of the MIPO I/O chiplet 103C is optically connected to the optical interface of the optical fanout chiplet 207C of the HBM card 205C. The HBM card 205A includes two HBM stacks 113 to which the optical fanout chiplet 207A is connected. The HBM card 205B includes two HBM stacks 113 to which the optical fanout chiplet 207B is connected. The HBM card 205C includes two HBM stacks 113 to which the optical fanout chiplet 207C is connected.

The SoC MCP 201D also includes the MIPO I/O chiplet 103D electrically connected to the HBM interface 107D of the GPU 203. The optical interface of the MIPO I/O chiplet 103D is optically connected through optical fiber arrays 115J, 115K, 115L to an optical interface of an optical fanout chiplet 207D of an HBM card 205D that includes two HBM stacks 113, in order to extend the memory of the SoC MCP 201D. The MIPO I/O chiplets 103A, 103B, 103C, and 103D are the same as described with regard to FIG. 1. Each of the optical fanout chiplets 207A, 207B, 207C, and 207D is like the optical fanout chiplet 111 described with regard to FIG.

1, except that each of the optical fanout chiplets 207A, 207B, 207C, and 207D is configured to electrically interface with the two HBM stacks 113 onboard the HBM cards 205A, 205B, 205C, and 205D, respectively. It should be understood that in other embodiments, the GPU 203 can be replaced with essentially any type of computer chip installed on the SoC MCP 201D.

In some embodiments, each of the HBM cards 205A, 205B, 205C, and 205D complies with the HBM2e standard. In these embodiments, each of the HBM cards 205A, 205B, 205C, and 205D includes two HBM stacks 113, where each HBM stack 113 is a half-stack having 4 or 6 die in order to fit the existing HBM2e standard. It should be understood that in various embodiments each of the HBM cards 205A, 205B, 205C, and 205D is configured to comply with essentially any of one or more HBM industry standards. Also, in some embodiments, a memory controller on the GPU 203 (or substituted computer chip) is modified to handle extra memory address bits for the remote HBM stack fanout provided by the four HBM cards 205A, 205B, 205C, and 205D, thereby exercising a memory capacity expansion for the SoC MCP 201D.

Figure 3:
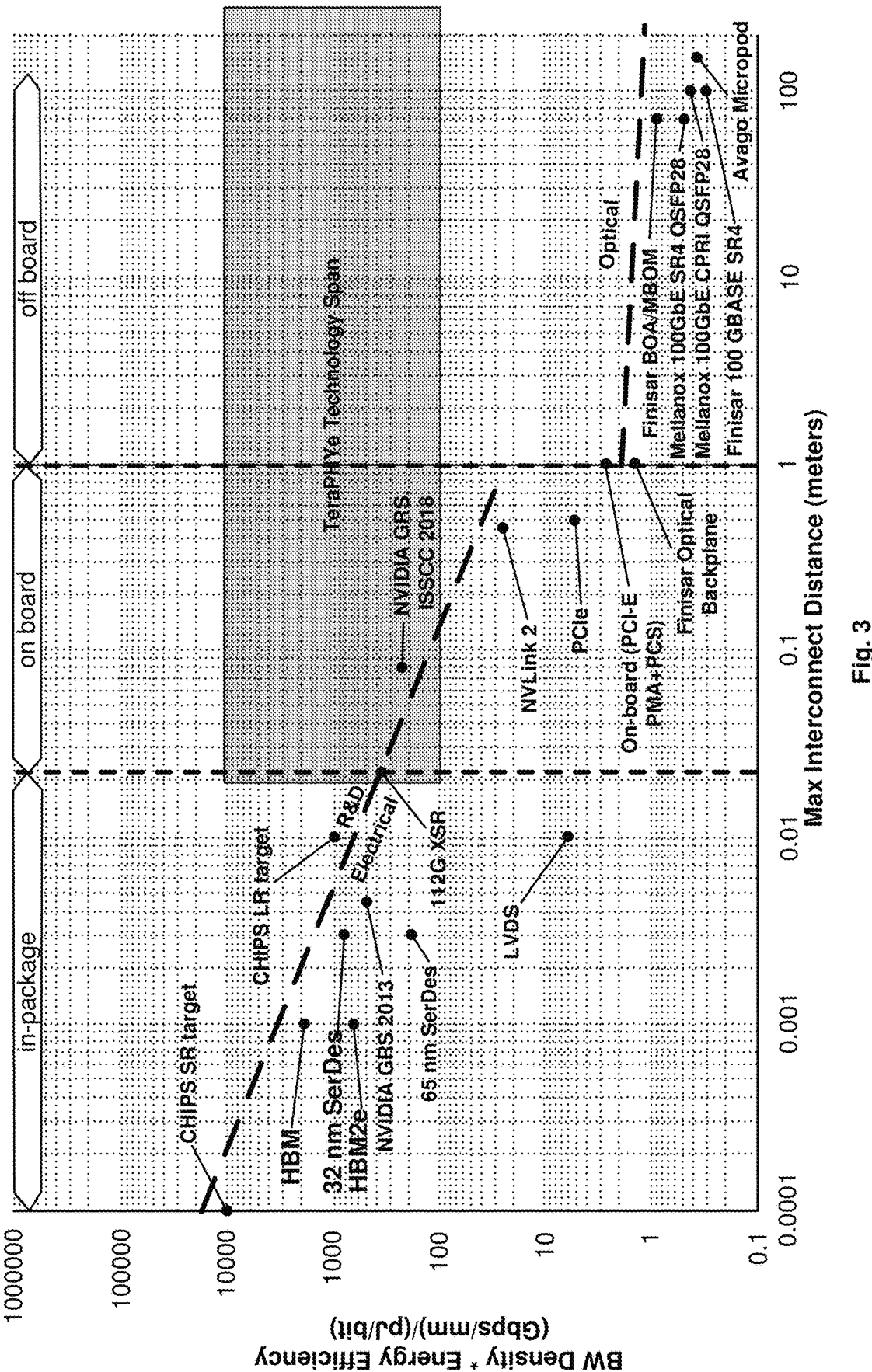
FIG. 3 shows interconnect metrics versus reach tradeoffs for various electrical and electro-optical semiconductor chip technologies, including the TeraPHY chiplets discussed herein, in accordance with some embodiments.

FIG. 3 shows interconnect metrics versus reach tradeoffs for various electrical and electro-optical semiconductor chip technologies, including the TeraPHY chiplets discussed herein, such as the TeraPHY MIPO I/O chiplets 103A-103D and the TeraPHY optical fanout chiplets 111, 207A, 207B, 207C, and 207D, in accordance with some embodiments. More specifically, FIG. 3 shows where the TeraPHY chiplets discussed herein that implement wavelength division multiplexing (WDM) technology reside within a plot of a product of energy efficiency and bandwidth density versus maximum interconnect span (or data communication reach) for various interconnect technologies. The product of energy efficiency and bandwidth density is plotted in units of Gigabit per second per millimeter divided by picojoule per bit [(Gbps/mm)/(pJ/bit)]. The maximum interconnect span is plotted in units of meters (m). FIG. 3 shows that the TeraPHY chiplet WDM technology is capable of providing communication over distances of a several kilometers (km) at the bandwidth-density and energy-cost of in-package interconnects. FIG. 3 also shows various technology metrics and comparison of the TeraPHY chiplet WDM technology with existing electrical and optical technologies. In this manner, FIG. 3 shows an example of where the TeraPHY chiplet WDM technology capability is particularly relevant. FIG. 3 also shows that the TeraPHY chiplet WDM technology enables an off-package data communication reach of more than two km with power, bandwidth, and latency properties similar to an in-package electrical interconnect. The TeraPHY chiplet integrates tens of millions of transistors and hundreds of optical devices to provide multiple Tbps of I/O bandwidth off of a single CMOS chiplet. Monolithic inte gration of transistors with optical devices, such as microring resonators, enables seamless insertion of the TeraPHY chiplet into the CMOS multi-chip packaging ecosystems, such as discussed with regard to the SoC MCP's 101, 201A-201D and HBM cards 109, 205, 205A-205D of FIGS. 1 and 2A-2D, while at the same time enabling a flexible electrical interface toward the host SoC.

Figure 4A:
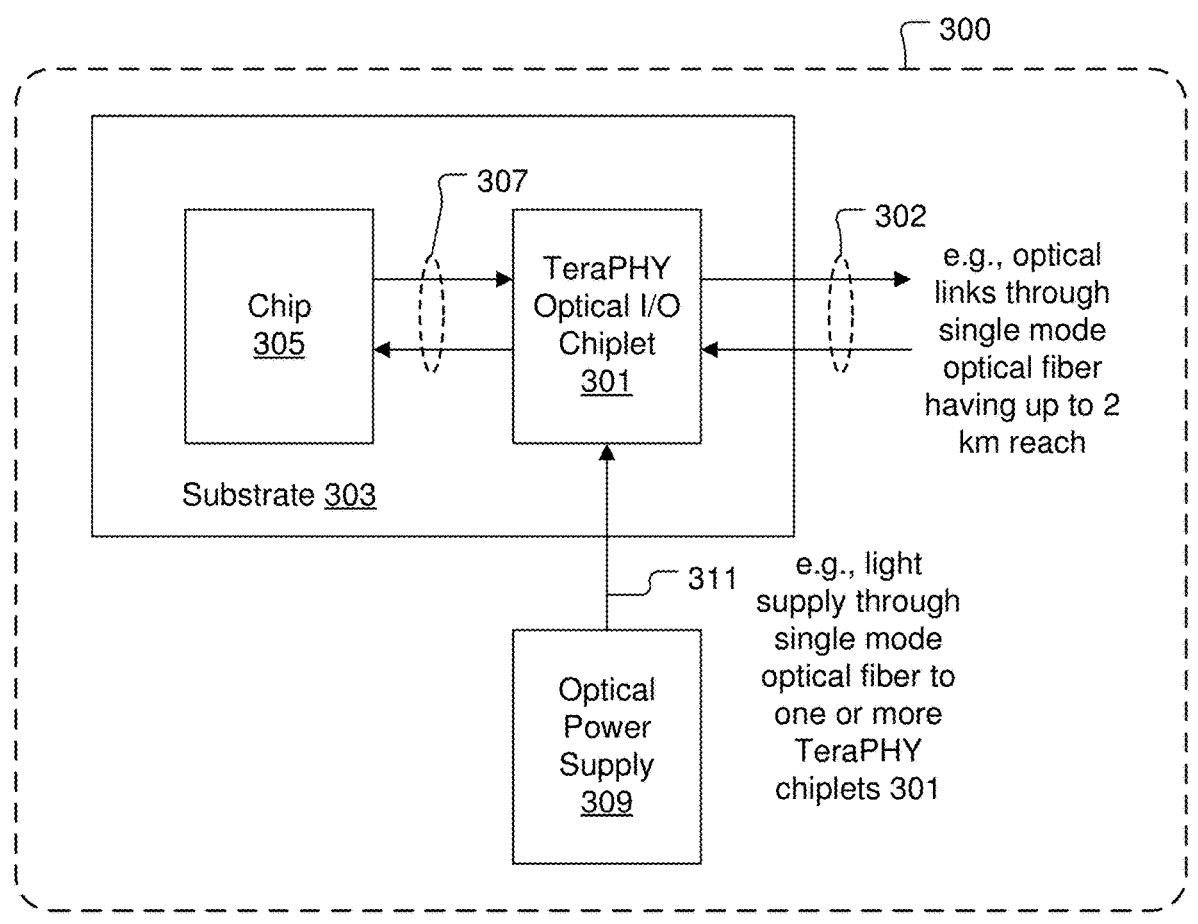
FIG. 4A shows an example block-level architecture of a system implementing the TeraPHY chiplet, in accordance with some embodiments.

FIG. 4A shows an example block-level architecture of a system 300 implementing the TeraPHY chiplet, in accordance with some embodiments. In various example embodiments, the system 300 represents any of the SoC MCP's 101, 201A-201D and HBM cards 109, 205, 205A-205D, or portions thereof, as described with regard to FIGS. 1 and 2A-2D. The system 300 also provides a general representation of any type of MCP referred to herein that is implemented to include the TeraPHY chiplet. The system 300 includes the TeraPHY chiplet 301 attached to a substrate 303. The TeraPHY chiplet 301 includes an optical interface that is optically connected to an optical link 302 through which bi-directional optical data communication is performed with another electro-optic device, such as with another TeraPHY chiplet 301. For example, with reference to FIG. 1, the MIPO I/O chiplet 103A and the optical fanout chiplet 111 are implemented as respective TeraPHY chiplets 301 that are optically connected for bi-directional optical data communication with each other through the optical link 302 defined by the optical fiber arrays 115A, 115B, 115C.

The system 300 also includes one or more semiconductor chips 305 attached to the substrate 303. In various embodiments, the one or more semiconductor chips 305 includes one or more of a central processing unit (CPU), a graphics processing unit (GPU), a visual processing unit (VPU), an application specific integrated circuit (ASIC), a field programmable gate array (FPGA), a memory chip, an HBM stack, an SoC, a microprocessor, a microcontroller, a digital signal processor (DSP), an accelerator chip, and/or essentially any other type of semiconductor chip. In various embodiments, the substrate 303 is an organic package and/or interposer. In some embodiments, the substrate 303 includes electrical connections/routings 307 between the TeraPHY chiplet 301 and the one or more semiconductor chips 305. In some embodiments, the electrical connections/routings 307 are formed within a redistribution layer (RDL) structure formed within the substrate 303. In various embodiments, the RDL structure is implemented in accordance with essentially any RDL structure topology and technology available within the semiconductor packaging industry. Some of the electrical connections/routings 307 within the substrate 303 are configured and used to provide electrical power and reference ground potential to the TeraPHY chiplet 301 and to each of the one or more semiconductor chips 305. Also, some electrical connections/routings 307 within the substrate 303 are configured and used to transmit electrical signals that provide for bi-directional digital data communication between the TeraPHY chiplet 301 and the one or more semiconductor chips 305. In various embodiments, digital data communication through the electrical connections/routings 307 between the TeraPHY chiplet 301 and the one or more semiconductor chips 305 is implemented in accordance with a digital data interconnect standard, such as the Peripheral Component Interconnect Express (PCIe) standard, the Compute Express Link (CXL) standard, the Gen-Z standard, the Open Coherent Accelerator Processor Interface (OpenCAPI), and/or the Open Memory Interface (OMI), among essentially any other digital data interconnect standard.

The system 300 also includes an optical power supply 309 optically connected to supply continuous wave laser light of one or more controlled wavelengths to the TeraPHY chiplet 301. In some embodiments, the optical power supply 309 is a SuperNova multi-wavelength, multi-port light supply provided by Ayar Labs, Inc. The optical power supply 309 supplies continuous wave (CW) light that optically powers the TeraPHY chiplet 301. In some embodiments, the optical power supply 309 is configured as a photonic integrated circuit (PIC) that generates multiple wavelengths of the CW light, multiplexes the multiple wavelengths of CW light onto a common optical fiber or optical waveguide, and splits and amplifies the multiplexed optical power to multiple output ports of the optical power supply 309 for transmission to multiple corresponding CW light input ports of the TeraPHY chiplet 301.

In various embodiments, the optical power supply 309 is optically connected to the TeraPHY chiplet 301 through one or more optical waveguides 311. In various embodiments, the one or more optical waveguides 311 includes one or more optical fibers and/or one or more optical waveguide structures formed within the substrate 303. In some embodiments, the optical power supply 309 is attached to the substrate 303. In some embodiments, the optical power supply 309 receives electrical power and electrical control signals through electrical connections/routings formed within the substrate 303. In some embodiments, the optical power supply 309 is implemented as a device physically separate from the substrate 303. In some of these embodiments, the optical power supply 309 is optically connected to the TeraPHY chiplet 301 through one or more optical fibers. In some of these embodiments, the optical power supply 309 is optically connected to the TeraPHY chiplet 301 through one or more optical fibers that are optically connected to the substrate 303 and through one or more optical waveguides formed within the substrate 303.

Figure 4B:
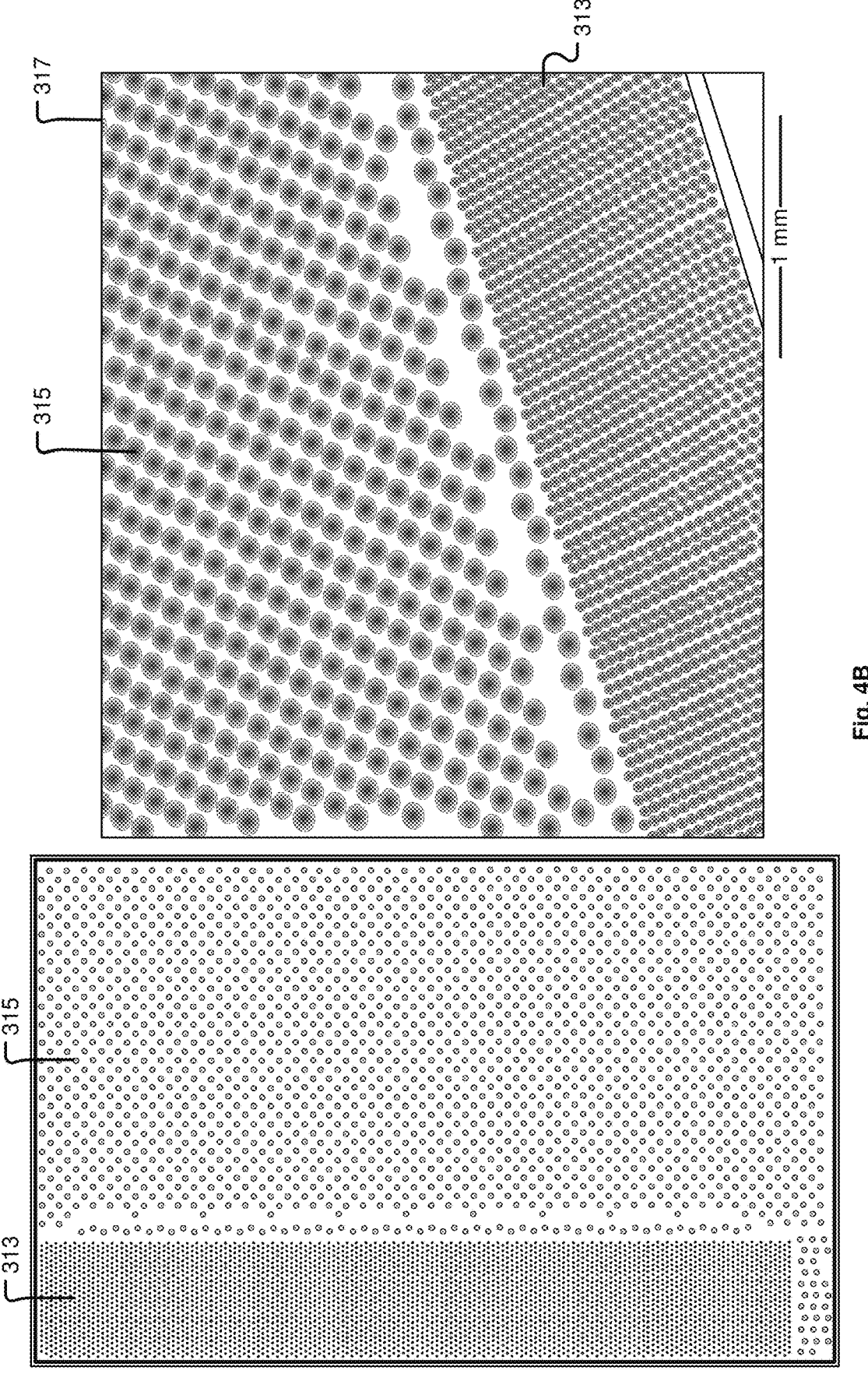
FIG. 4B shows an example view of a parallel interface side of the TeraPHY MIPO I/O chiplet and the parallel electrical interface bump pitch pattern that is used to electrically connect the TeraPHY MIPO I/O chiplet to the electrical connections/routings in the substrate, in accordance with some embodiments.

FIG. 4B shows an example view of a parallel interface side 313 of the TeraPHY MIPO I/O chiplet 301 and the parallel electrical interface bump pitch pattern 315 that is used to electrically connect the TeraPHY MIPO I/O chiplet 301 to the electrical connections/routings 307 in the substrate 303, in accordance with some embodiments. In various embodiments, the TeraPHY MIPO I/O chiplet 301 is electrically connected to the chip 305 with low-power, short reach in-package electrical interconnect technologies. FIG. 4B also shows a scanning electron microscope (SEM) image 317 of a portion of the bumps on the parallel interface side of the TeraPHY MIPO I/O chiplet 301. In some embodiments, the bumps on the parallel interface side of the TeraPHY MIPO I/O chiplet 301 are arranged in accordance with a bump pitch (bump center-to-bump center distance) of about 55 micrometers. However, it should be understood that in various embodiments, the bumps on the parallel interface side of the TeraPHY MIPO I/O chiplet 301 are arranged in accordance with a pitch that is either less than or greater than about 55 micrometers.

Figure 4C:
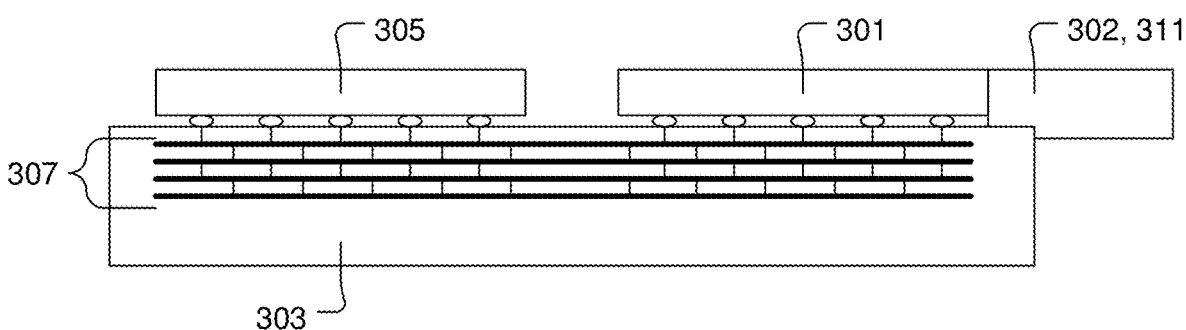
FIG. 4C shows a vertical cross-section diagram of the substrate of FIG. 1A, in accordance with some embodiments.

In some embodiments, the substrate 303 includes routings of electrical traces configured to carry electrical power, electrical ground, electrical data input signals, and electrical data output signals for the TeraPHY MIPO I/O chiplet 301 and the chip 305. In some embodiments, the chip 305 is electrically connected to the TeraPHY MIPO I/O chiplet 301 through the electrical connections/routings 307 formed within the substrate 303. In some embodiments, the electrical connections/routings 307 are implemented within the substrate 303 as one or more RDL structure(s). FIG. 4C shows a vertical cross-section diagram of the substrate 303 of FIG. 1A, in accordance with some embodiments. In some embodiments, the electrical connections/routings 307 of the RDL structure(s) are formed in multiple levels of the substrate 303. In some embodiments, the electrical connections/routings 307 include electrically conductive via structures formed to provide electrical connections between electrical traces formed in different levels of the substrate 303, as represented by the vertical lines between different levels of the electrical connections/routings 307 in FIG. 4C. It should be understood that in various embodiments the electrical connections/routings 307 are configured in essentially any manner as needed to provide required electrical connectivity between the chip 105 and the TeraPHY MIPO I/O chiplet 301, and to provide electrical power to each of the chip 105 and the TeraPHY MIPO I/O chiplet 301, and to provide a reference ground potential connection to each of the chip 105 and the TeraPHY MIPO I/O chiplet 301.

Figure 5:
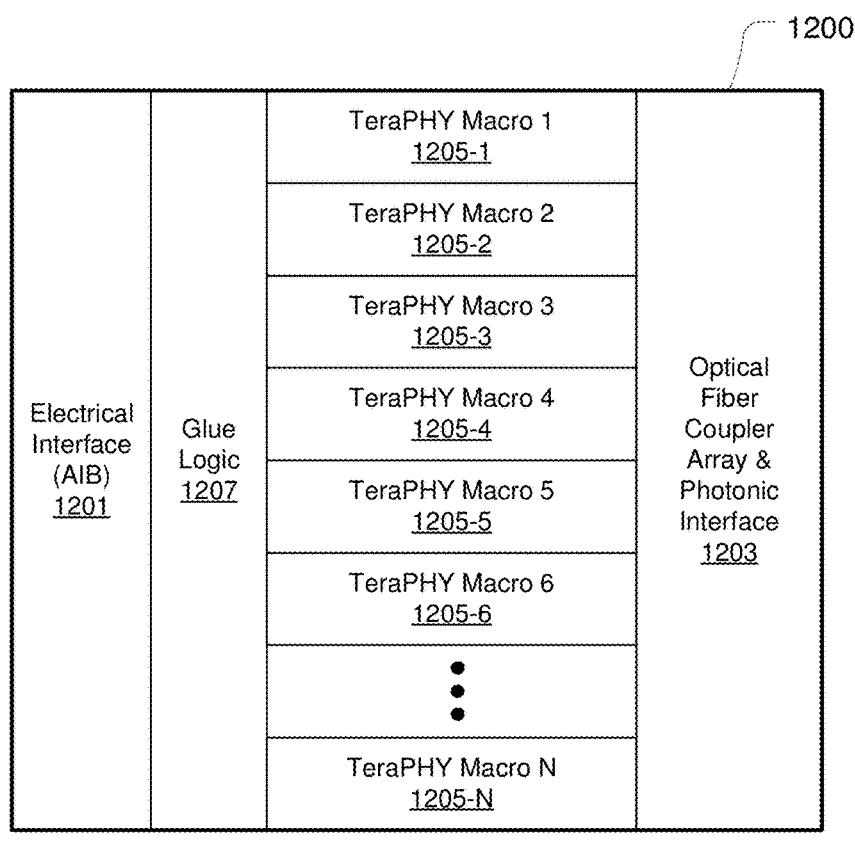
FIG. 5 shows an example organizational diagram of the TeraPHY chiplet referenced herein, in accordance with some embodiments.

FIG. 5 shows an example organizational diagram of the TeraPHY chiplet referenced herein, in accordance with some embodiments. The TeraPHY chiplet is denoted by reference numeral 1200 in FIG. 5. However, it should be understood that the description of the TeraPHY chiplet 1200 provided herein is applicable to each TeraPHY chiplet as referenced herein, such as TeraPHY chiplets 103A, 103B, 103C, 103D, 111, 207A, 207B, 207C, 207D, 401, 503, 503-1, 503-2, 503A, 503B, and 503C. The organizational diagram has an electrical interface 1201 separated (split) from a photonic interface 1203. The photonic interface 1203 is configured to optically couple with the corresponding fiber array unit (FAU) 1601 (see FIG. 9). In the example of FIG. 5, the electrical interface 1201 is on a left side of the TeraPHY chiplet 1200, and the photonic interface 1203 (for the FAU 1601) is on a right side of the TeraPHY chiplet 1200. A number (1 to N) of optical macros 1205-1 to 1205-N are located between the photonic interface 1203 and the electrical interface 1201. The electrical interface 1201 is connected to the optical macros 1205-1 to 1205-N by glue logic 1207. The electrical interface 1201 of the TeraPHY chiplet 1200 is adaptable to the logic of an integrated circuit chip to which the TeraPHY chiplet 1200 connects. In the example of FIG. 5, the flow of data from electronics-to-optics is from left-to-right. Conversely, in the example of FIG. 5, the flow of data from optics-to-electronics is from right-to-left.

The electrical interface 1201 is a block of circuitry configured to handle all electrical I/O to and from the integrated circuit chip to which the TeraPHY chiplet 1200 connects, such as an Ethernet switch chip/die, or other type of integrated circuit chip. The optical macros 1205-1 to 1205-N are responsible for conversion of data signals between the optical and electrical domains. Specifically, each of the optical macros 1205-1 to 1205-N is configured to convert electrical data signals received through the electrical interface 1201 into optical data signals for transmission through the photonic interface 1203. Also, each of the optical macros 1205-1 to 1205-N is configured to convert optical data signals received through the photonic interface 1203 into electrical data signals for transmission through the electrical interface 1201. The photonic interface 1203 is responsible for coupling optical signals to and from the optical macros 1205-1 to 1205-N. The glue logic 1207 enables flexible (dynamic or static) mapping of the electrical interface 1201 to the optical macros 1205-1 to 1205-N and associated optical wavelengths. In this manner, the glue logic 1207 (also called crossbar circuitry) provides dynamic routing of electrical signals between the optical macros 1205-1 to 1205-N and the electrical interface 1201. The glue logic 1207 also provides for retiming, rebuffering, and flit reorganization functions at the phy-level. Also, in some embodiments, the glue logic 1207 implements various error correction and data-level link protocols to offload some processing from the integrated circuit chip to which the TeraPHY chiplet 1200 connects.

Figure 6:
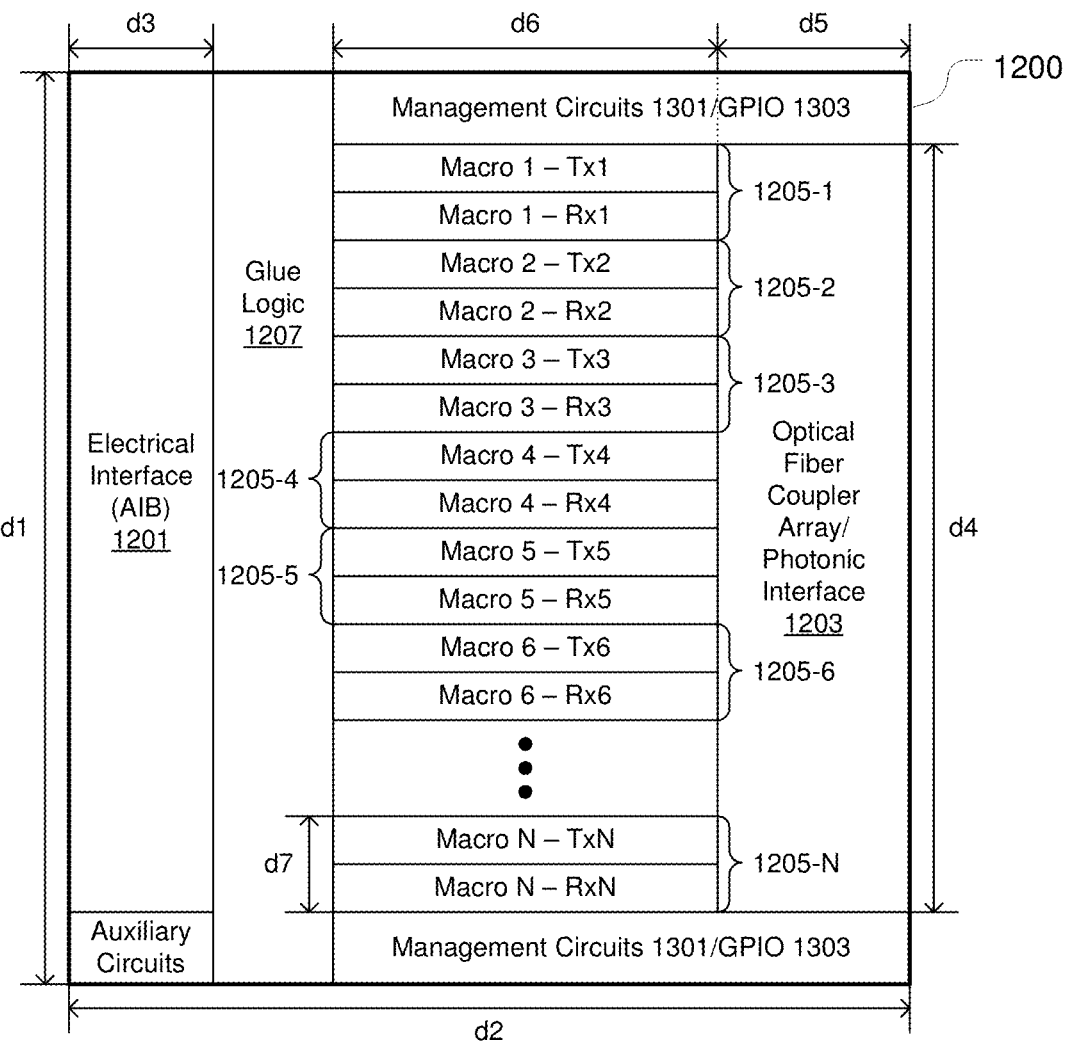
FIG. 6 shows an example layout of the TeraPHY chiplet, in accordance with some embodiments.

FIG. 6 shows an example layout of the TeraPHY chiplet 1200, in accordance with some embodiments. The layout of the optical and electrical components of the TeraPHY chiplet 1200 is designed to optimize area efficiency, energy efficiency, performance, and practical considerations such as avoiding optical waveguide crossings. In some embodiments, the electrical interface 1201 is laid out along one chip edge (left side edge in FIG. 6), and the photonic interface

1203 for optical coupling with the FAU 1601 is laid out along the opposite chip edge (right side edge in FIG. 6). In some embodiments, the photonic interface 1203 includes an optical grating coupler for each of the optical fibers in the FAU 1601. In various embodiments, the photonic interface 1203 includes vertical optical grating couplers, edge optical couplers, or essentially any other type of optical coupling device, or combination thereof to enable optical coupling of the FAU 1601 with the optical macros 1205-1 to 1205-N. In some embodiments, the photonic interface 1203 is configured to interface with 24 optical fibers within the FAU 1601. In some embodiments, the photonic interface 1203 is configured to interface with 16 optical fibers within the FAU 1601. The glue logic 1207 routes data between the electrical interface 1201 and the optical macros 1205-1 to 1205-N. The glue logic 1207 includes cross-bar switches and other circuitry as needed to interface the electrical interface 1201 connections with the optical macros 1205-1 to 1205-N. In some embodiments, the optical transmitters (Tx) and optical receivers (Rx) of the optical macros 1205-1 to 1205-N are combined in pairs, with each Tx/Rx pair forming an optical transceiver. The glue logic 1207 enables dynamic mapping of electrical lanes/channels to optical lanes/channels. The optical macros 1205-1 to 1205-N (for data transmitting (Tx) and data receiving (Rx)) are laid out in between the glue logic 1207 and the photonic interface 1203 that couples with the FAU 1601. The optical macros 1205-1 to 1205-N include both optical and electrical circuitry responsible for converting electrical signals to optical signals and for converting optical signals to electrical signals.

In some embodiments, the electrical interface 1201 is configured to implement the Advanced Interface Bus (AIB) protocol to enable electrical interface between the TeraPHY chiplet 1200 and one or more other integrated circuit chips. It should be understood, however, that in other embodiments the electrical interface 1201 can be configured to implement essentially any electrical data communication interface other than AIB. For example, in some embodiments, the electrical interface 1201 includes a High Bandwidth Memory (HBM) and Kandou Bus for serialization/deserialization of data.

In some embodiments, the TeraPHY chiplet 1200 has a length d1 and a width d2, where d1 is about 8.9 millimeters (mm) and d2 is about 5.5 mm. It should be understood that the term "about," as used herein, means+/−10% of a given value. In some embodiments, the length d1 is less than about 8.9 mm. In some embodiments, the length d1 is greater than about 8.9 mm. In some embodiments, the width d2 is less than about 5.5 mm. In some embodiments, the width d2 is greater than about 5.5 mm. In some embodiments, the electrical interface 1201 has a width d3 of about 1.3 mm. In some embodiments, the width d3 is less than about 1.3 mm. In some embodiments, the width d3 is greater than about 1.3 mm. In some embodiments, the photonic interface 1203 for the optical fiber array has a length d4 of about 5.2 mm and a width d5 of about 2.3 mm. In some embodiments, the length d4 is less than about 5.2 mm. In some embodiments, the length d4 is greater than about 5.2 mm. In some embodiments, the optical macros 1205-1 to 1205-N have a width d6 of about 1.8 mm. In some embodiments, the width d6 is less than about 1.8 mm. In some embodiments, the width d6 is greater than about 1.8 mm. In some embodiments, each transmitter Tx and receiver Rx optical macro 1205-1 to 1205-N pair has a length d7 of about 0.75 mm. In some embodiments, the length d7 is less than about 0.75 mm. In some embodiments, the length d7 is greater than about 0.75 mm. In some embodiments, the transmitter Tx and receiver Rx optical macros 1205-1 to 1205-N are positioned to align with an optical fiber pitch within the photonic interface 1203. In some embodiments, the length d7 of each optical macro 1205-1 to 1205-N (pair of transmitter (Tx) and receiver (Rx) optical macros) is matched to the pitch of the optical fibers in a standard optical fiber ribbon. For example, if the optical fiber pitch is 250 micrometers, and three of the optical fibers in the optical fiber ribbon correspond to one optical macro 1205-1 to 1205-N (one optical fiber brings continuous wave light to the transmitter (Tx) optical macro from a laser, one optical fiber transmits data as modulated light from the transmitter (Tx) optical macro, and one optical fiber brings modulated light carrying encoded data to the receiver (Rx) optical macro), then the optical macro length d7 is 750 micrometers.

In some embodiments, the number N of optical macros 1205-1 to 1205-N is 8. In some embodiments, the number N of optical macros 1205-1 to 1205-N is less than 8. In some embodiments, the number N of optical macros 1205-1 to 1205-N is greater than 8. Also, each of the optical macros 1205-1 to 1205-M represents an optical port. In some embodiments, a dual phase lock loop (PLL) circuit is shared by each transmitter Tx/receiver Rx pair within the optical macros 1205-1 to 1205-N. In some embodiments, the dual PLL includes a PLLU that covers a frequency range from 24 GigaHertz (GHz) to 32 GHz, and a PLLD that covers a frequency range from 15 GHz to 24 GHz.

The TeraPHY chiplet 1200 also includes management circuits 1301 and general purpose input/output (GPIO) components 1303 for communicating electrical data signals to and from the TeraPHY chiplet 1200. In various embodiments, the GPIO components 1303 include Serial Peripheral Interface (SPI) components and/or another type of component to enable off-chip data communication. Also, in some embodiments, the TeraPHY chiplet 1200 includes many other circuits, such as memory (e.g., SRAM), a CPU, analog circuits, and/or any other circuit that is implementable in CMOS.

Figure 7:
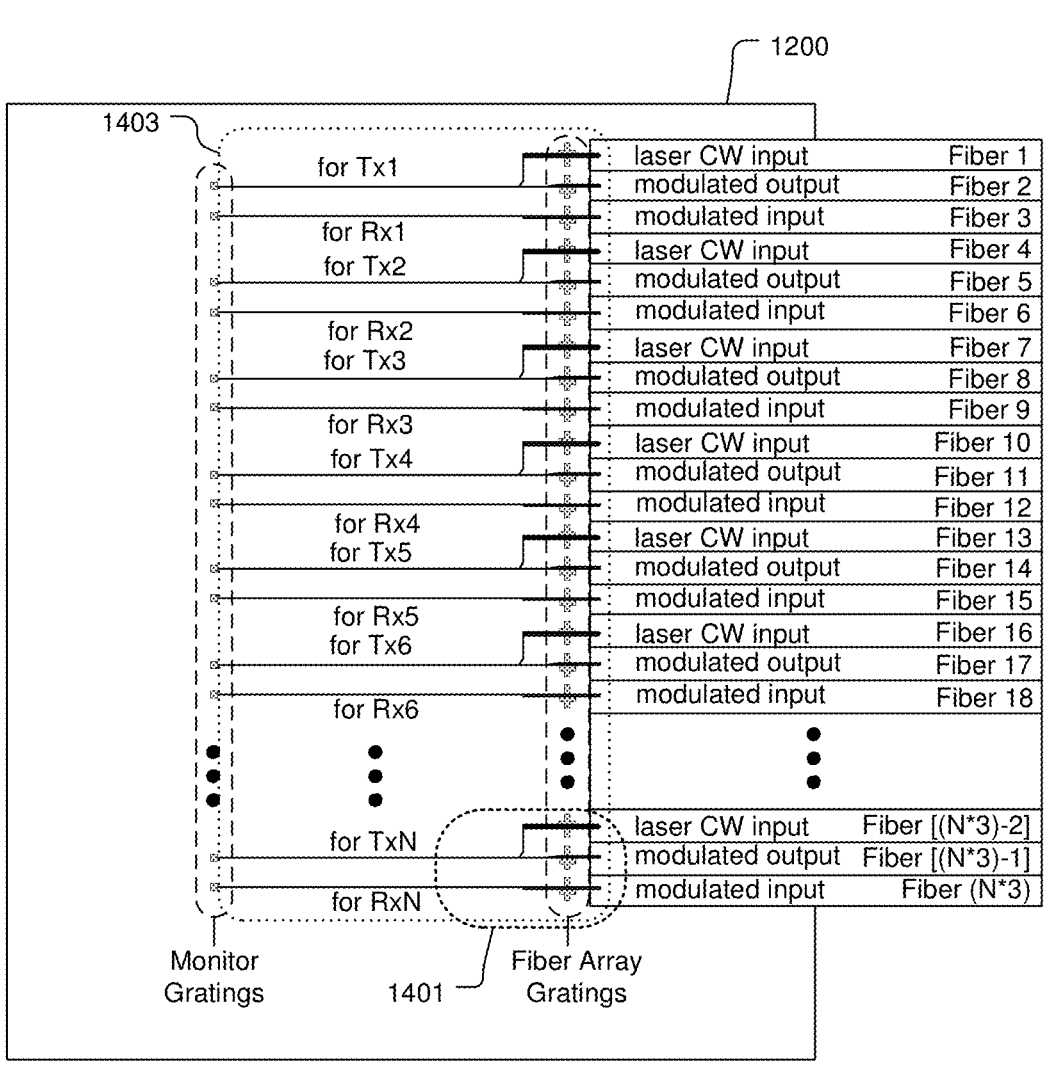
FIG. 7 shows an example layout of photonic structures of the TeraPHY chiplet, in accordance with some embodiments.

FIG. 7 shows an example layout of photonic structures of the TeraPHY chiplet 1200, in accordance with some embodiments. FIG. 7 shows some optical waveguides 1403 and associated optical grating structures 1401 of the optical layout of the TeraPHY chiplet 1200, but some portions of the optical layout such as optical microring resonators and associated electronics are not shown in order to avoid obscuring the optical layout. The floorplan of the TeraPHY chiplet 1200 has the optical fibers coming in on the right side of the TeraPHY chiplet 1200. Light is coupled from the optical fibers into the optical fiber grating couplers 1401 on the TeraPHY chiplet 1200. The light coupled into the optical grating couplers 1401 is guided by the optical waveguides 1403 to the inputs of the optical macros 1205-1 to 1205-N. Each optical macro 1205-1 to 1205-N has three optical fiber connections, including one optical fiber connection for the continuous wave laser light input to the optical transmitter (Tx input), one optical fiber connection for the optical output from the optical transmitter (Tx output), and one optical fiber connection for the modulated optical input to the optical receiver (Rx input).

In some embodiments, the optical layout shown in FIG. 7 uses single-polarization optical grating couplers 1401 as the optical coupling structures from the optical fibers to the TeraPHY chiplet 1200. In some embodiments, when the TeraPHY chiplet 1200 uses dual-polarization inputs, the optical layout includes polarization splitting optical grating couplers 1401 followed by an optical combiner structure. In some embodiments, when the TeraPHY chiplet 1200 uses dual-polarization inputs and the optical grating couplers 1401 support both TE/TM polarization states, the optical layout includes a polarization splitter-rotator followed by an optical combiner structure, such that the optical waveguide interfaces (Tx input, Tx output, Rx input) to the optical macros 1205-1 to 1205-N have a single polarization. In various embodiments, the optical layout of FIG. 7 is mirrored, rotated, or both mirrored and rotated. Also, in some embodiments, the optical fiber coupler array 1203 organization of the TeraPHY chiplet 1200 includes optical edge couplers based on mode converters, V-grooves, and/or other optical fiber coupling mechanisms.

Figure 8:
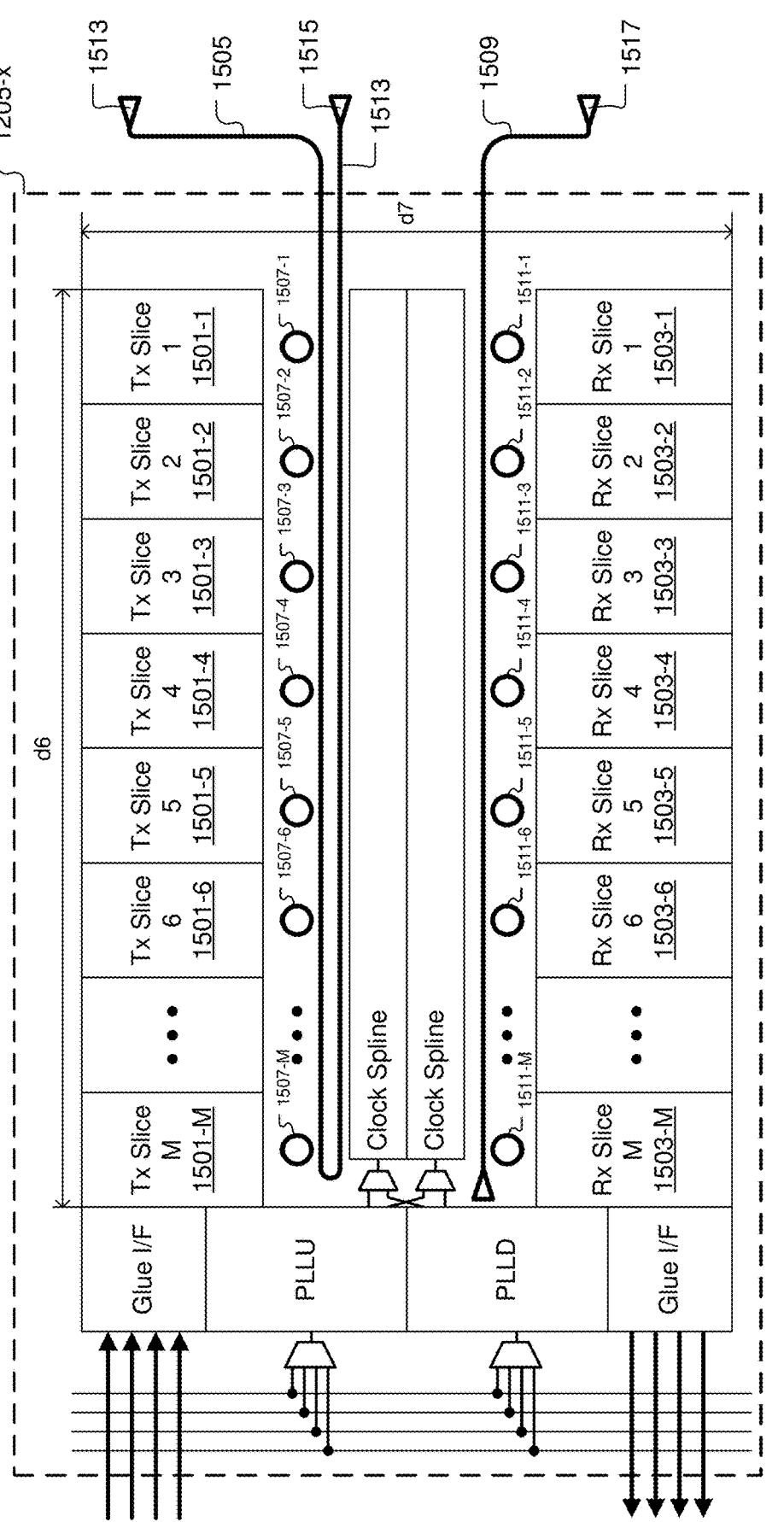
FIG. 8 shows an example layout of a given one of the optical macros of the TeraPHY chiplet, in accordance with some embodiments.

FIG. 8 shows an example layout of a given one of the optical macros 1205-1 to 1205-N, referred to as optical macro 1205-x, in accordance with some embodiments. The optical macro 1205-x includes a number M of transmit (Tx) slices 1501-1 to 1501-M and a number M of receive (Rx) slices 1503-1 to 1503-M. An optical slice of the optical macro 1205-x refers to either a single one of the optical transmitter slices 1501-1 to 1501-M, or a single one of the optical receiver slices 1503-1 to 1503-M, or a combination of a single one of the optical transmitter slices 1501-1 to 1501-M and a corresponding single one of the optical receiver slices 1503-1 to 1503-M, where the single one of the optical transmitter slices 1501-1 to 1501-M and the single one of the optical receiver slices 1503-1 to 1503-M operates using a single wavelength of light. The example layout of FIG. 8 shows the routing of an optical waveguide 1505 and the placement of optical microring resonators 1507-1 to 1507-M within the transmit (Tx) portion of the optical macro 1205-x. The microring resonators 1507-1 to 1507-M function as modulators. The example layout of FIG. 8 also shows the routing of an optical waveguide 1509 and the placement of optical microring resonators 1511-1 to 1511-M within the receive (Rx) portion of the optical macro 1205-x. The microring resonators 1511-1 to 1511-M function as photodetectors. In some embodiments, one or more of the microring resonators 1507-1 to 1507-M and 1511-1 to 1511-M are controlled to function as an optical multiplexer and/or as an optical demultiplexer.

Each corresponding pair of the transmit (Tx) slices 1501-1 to 1501-M and the receive (Rx) slices 1503-1 to 1503-M forms a slice of the optical macro 1205-x. For example, Tx Slice 1 1501-1 and Rx Slice 1 1503-1 together form a Slice 1 of the optical macro 1205-x. The transmit (Tx) slices 1501-1 to 1501-M include electrical circuitry for directing translation of electrical data in the form of a bit stream into a stream of modulated light by operating the microring resonators 1507-1 to 1507-M to modulate the continuous wave laser light incoming through the optical waveguide 1505 at a given wavelength into a stream of modulated light at the given wavelength. The receive (Rx) slices 1503-1 to 1503-M include electrical circuitry for detecting light of a given wavelength within a stream of modulated light incoming through the optical waveguide 1509 by operating the microring resonators 1511-1 to 1511-M. The electrical circuitry within the receive (Rx) slices 1503-1 to 1503-M translate the light that is detected by the microring resonators 1511-1 to 1511-M at a corresponding wavelength into a bit stream in the electrical domain.

The optical waveguide 1505 routes continuous wave laser light from an optical input 1513 to each of the microring resonators 1507-1 to 1507-M within the transmit (Tx) slices 1501-1 to 1501-M. The optical waveguide 1505 also routes modulated light from the microring resonators 1507-1 to 1507-M within the transmit (Tx) slices 1501-1 to 1501-M to an optical output 1515. In some embodiments, each of the microring resonators 1507-1 to 1507-M within the transmit (Tx) slices 1501-1 to 1501-M is tunable to operate at a specified wavelength of light. Also, in some embodiments, the specified wavelength of light at which a given microring resonator 1507-x is tuned to operate is different than the specified wavelengths at which the other microring resonators 1507-1 to 1507-M, excluding 1507-x, are tuned to operate. In some embodiments, a corresponding heating device is positioned near each of the microring resonators 1507-1 to 1507-M provide for thermally tuning of the resonant wavelength of the microring resonator. In some embodiments, each of the microring resonators 1507-1 to 1507-M is connected to corresponding electrical tuning circuitry that is operated to electrically tune the resonant wavelength of the microring resonator.

The optical waveguide 1509 routes incoming modulated light from an optical input 1517 to the microring resonators 1511-1 to 1511-M within the receive (Rx) slices 1503-1 to 1503-M. In some embodiments, each of the microring resonators 1511-1 to 1511-M within the receive (Rx) slices 1503-1 to 1503-M is tunable to operate at a specified wavelength of light. Also, in some embodiments, the specified wavelength of light at which a given microring resonator 1511-x is tuned to operate is different than the specified wavelengths at which the other microring resonators 1511-1 to 1511-M, excluding 1511-x, are tuned to operate. In some embodiments, a corresponding heating device is positioned near each of the microring resonators 1511-1 to 1511-M provide for thermally tuning of the resonant wavelength of the microring resonator. In some embodiments, each of the microring resonators 1511-1 to 1511-M is connected to corresponding electrical tuning circuitry that is operated to electrically tune the resonant wavelength of the microring resonator.

In some embodiments, the architecture and floorplan of the optical macro 1205-x is variable by including a different number of PLLs at various positions within the optical macro 1205-x. For example, in some embodiments, a centralized PLL is positioned within the clock spine and fans out to the slices at both sides of the optical macro 1205-x. In various embodiments, the PLL is replicated as multiple PLL instances across the optical macro 1205-x, with each PLL instance either dedicated to a given transmit (Tx)/receive (Rx) slice or shared with a subset of transmit (Tx)/receive (Rx) slices. In various embodiments, other floorplan configurations of the optical macro 1205-x include multiple columns of optical macros with pass-through photonic rows, to increase the edge bandwidth density, and/or staggering of the transmit (Tx) and receive (Rx) optical macros side-by-side to increase the edge bandwidth density.

The optical macro 1205-x includes both photonic and electronic components. The optical waveguides 1505 and 1509 in the optical macro 1205-x are laid out so as to avoid optical waveguide crossings and so as to minimize optical waveguide length, which minimizes optical losses, and correspondingly improves the energy efficiency of the system. The optical macro 1205-x is laid out in such a way as to minimize the distance between the electronic components and the optical components in order to minimize electrical trace length, which improves the energy efficiency of the optical macro 1205-x, enables faster signal transmission, and reduces chip size.

The TeraPHY chiplet 1200 includes the set of (N) optical macros 1205-1 to 1205-N. Each optical macro 1205-x includes the set of (M) optical transmitter slices 1501-1 to 1501-M and optical receiver slices 1503-1 to 1503-M that are logically grouped together to transmit or receive bits on a number (W) of different optical wavelengths on the respective optical waveguide 1505, 1509. In various embodiments, the number (M) of optical transmitter slices 1501-1 to 1501-M and optical receiver slices 1503-1 to 1503-M and the number (W) of different optical wavelengths can be defined as needed, considering that any number of optical transmitter slices 1501-1 to 1501-M and/or optical receiver slices 1503-1 to 1503-M is tunable to a given one of the number (W) of optical wavelengths. However, if data bits are being transmitted or received by multiple ones of the optical microring resonators 1507-1 to 1507-M, or by multiple ones of the optical microring resonators 1511-1 to 1511-M, tuned to the same optical wavelength, channel/wavelength contention is managed. The floorplan and organization of the optical macro 1205-x represent adjustable degrees of freedom for controlling the following metrics:

optical waveguide 1505, 1509 length (which directly correlates with optical loss)

optical macro 1205-x area (which correlates with manufacturing cost)

energy consumed per bit (energy efficiency)

electrical signaling integrity (which correlates with performance)

electrical package escape (the amount of electrical data input and output that is physically available for a given set of chip dimensions and for a given spacing/pitch of electrical bumps)

optical package escape (the amount of optical data input and output that is physically available for a given set of chip dimensions and for a given spacing/pitch of optical fibers).

Figures 9, 10:
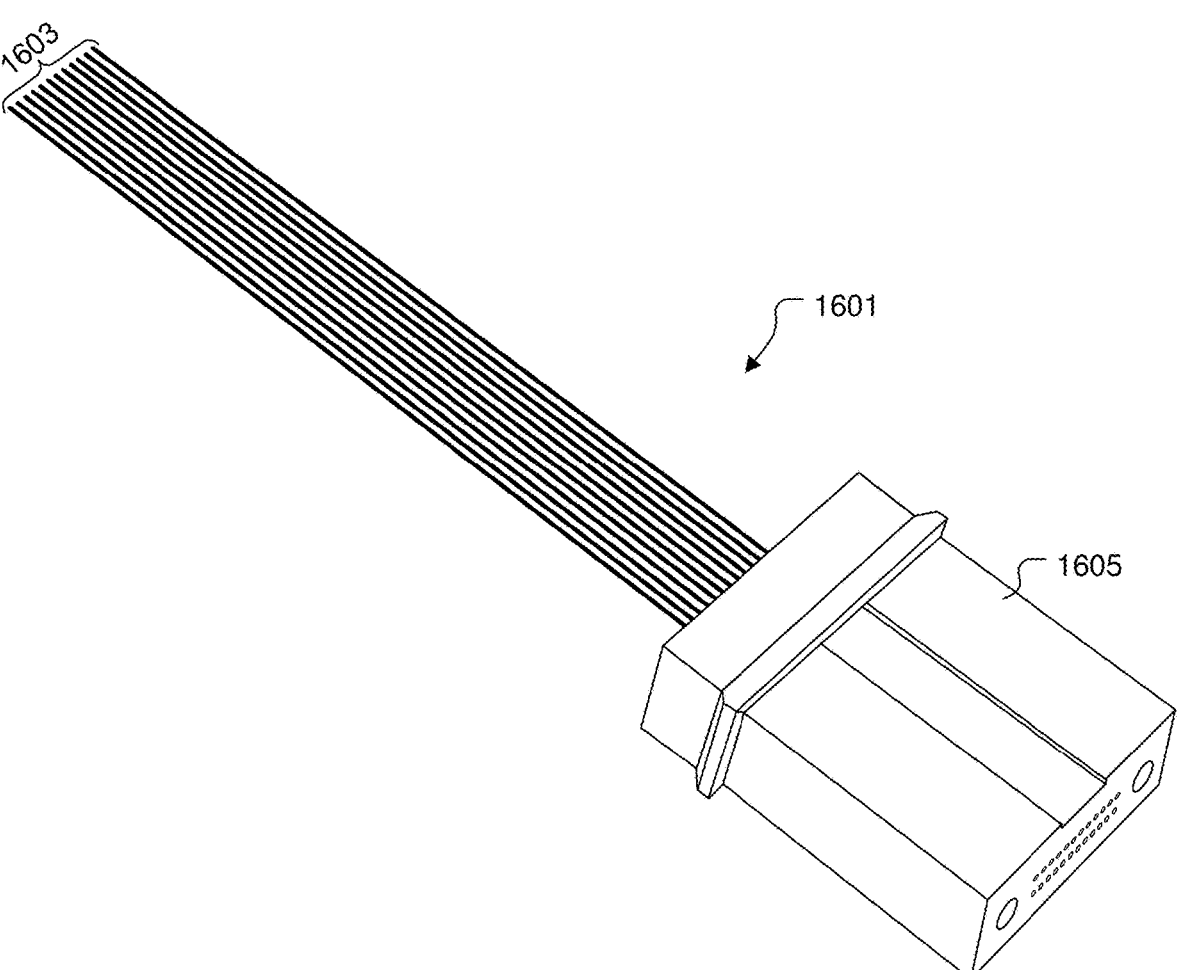
FIG. 9 shows an example FAU for connection to the TeraPHY chiplet, in accordance with some embodiments.
FIG. 10 shows a top view of an HBM card implemented as a multi-chip package that includes a combination of a TeraPHY chiplet and an electrical fanout chiplet, in accordance with some embodiments.

FIG. 9 shows an example FAU 1601 for connection to the TeraPHY chiplet 1200, in accordance with some embodiments. In some embodiments, the FAU 1601 connects multiple optical fibers to the TeraPHY chiplet 1200. In some embodiments, the FAU 1601 represents any one or more of the optical fiber arrays 115A, 115C, 115D, 115F, 115I, 115G, 115L, 115J, 509, 709, 711, 807, 809, 907 described herein. In some embodiments, the FAU 1601 includes an optical fiber pigtail 1603 that includes multiple optical fibers that connect to the optical fiber coupler array 1203 of the TeraPHY chiplet 1200. In some embodiments, some of the optical fibers within the optical fiber pigtail 1603 are polarization maintaining single mode optical fibers (PMF), such as used for carrying continuous wave laser light from an external laser device to the TeraPHY chiplet 1200. Also, in some embodiments, some of the optical fibers within the optical fiber pigtail 1603 are non-polarization maintaining single mode optical fibers (SMF) for carrying modulated light signals to and/or from the TeraPHY chiplet 1200. In some embodiments, the FAU 1601 includes a mechanical transfer (MT) ferrule 1605, such as an MTP® connector. In some embodiments, the FAU 1601 is configured to connect up to 24 optical fibers to the TeraPHY chiplet 1200. For example, in some embodiments, the MT ferrule 1605 is configured as a 2×12 MTP® connector ferrule.

In some embodiments, the TeraPHY chiplet 1200 has a coarse wavelength division multiplexing 4-lane (CWDM4) configuration in which each of the optical macros 1205-1 to 1205-M includes four serializer/deserializer (SerDes) slices (FR-4) or eight SerDes slices (FR-8). In some embodiments, the optical macros 1205-1 to 1205-M are divided into wavelength transmit (Tx)/receive (Rx) slices, with each Tx/Rx slice including fully integrated analog Tx/Rx front-ends, serialization/deserialization, clock-data-recovery, and microring resonator thermal tuning digital control. In some embodiments, the photonic components integrated in each Tx/Rx slice/optical macro 1205-x optical port are based on microring resonators (such as modulators, filters, etc.). In some embodiments, the TeraPHY chiplet 1200 optically couples to the FAU 1601 through edge-coupled V-groove structures with embedded mode-converters.

The TeraPHY MIPO I/O chiplet has a small footprint because the intellectual property (IP) building blocks on the chip are dense. These IP building blocks include optical micro-ring resonators, which are used for multiplexing and demultiplexing multiple wavelengths of light onto single waveguides, as well as modulating light and acting as photodetectors, in a very small chip area (for example 10 micrometer diameter per micro-ring). The IP building blocks on the chip are also dense because the electrical circuitry that controls the optical devices is closely integrated on the same chip with the optical devices that they control, making it possible to optimize space efficiency. The small TeraPHY MIPO I/O chiplet footprint enables higher ratios of total memory and memory bandwidth to the SoC.

In some embodiments, each of the optical fanout chiplets 111, 207, 207A, 207B, 207C, 207D, as shown in FIGS. 1 through 2D, includes both a TeraPHY chiplet by Ayar Labs, Inc. and an electrical fanout chiplet integrated together within a single chip. In these embodiments, the TeraPHY chiplet provides the transition from the optical domain to the electrical domain, and vice-versa. And, the electrical fanout chiplet provides electrical connection between the HBM stacks 113 and the TeraPHY chiplet.

In some embodiments, each of the optical fanout chiplets 111, 207, 207A, 207B, 207C, 207D, as shown in FIGS. 1 through 2D, is substituted for by a combination of a TeraPHY chiplet and an electrical fanout chiplet, where the TeraPHY chiplet and the electrical fanout chiplet are implemented as separate chips in the multi-chip package that includes the HBM stacks 113. For example, FIG. 10 shows a top view of an HBM card 400 implemented as a multi-chip package that includes a combination of a TeraPHY chiplet 401 and an electrical fanout chiplet 403, in accordance with some embodiments. The TeraPHY chiplet 401 and the electrical fanout chiplet 403 are implemented as separate chips in the multi-chip package, along with a number of HBM stacks 113. In various embodiments, the HBM card 400 can be used in place of any of the TeraPHY-HBM MCP's 109, 205, 205A, 205B, 205C, 205D, as shown in FIGS. 1 through 2D. In some embodiments, the TeraPHY chiplet 401 and the electrical fanout chiplet 403 are electrically connected through a redistribution layer (RDL) of the TeraPHY-HBM MCP 400. In some embodiments, the TeraPHY chiplet 401 and the electrical fanout chiplet 403 are electrically connected through electrical via structures formed within the TeraPHY-HBM MCP 400. In some embodiments, the TeraPHY chiplet 401 and the electrical fanout chiplet 403 are electrically connected through a ball-grid-array (BGA) or other similar technology.

Figure 11A:
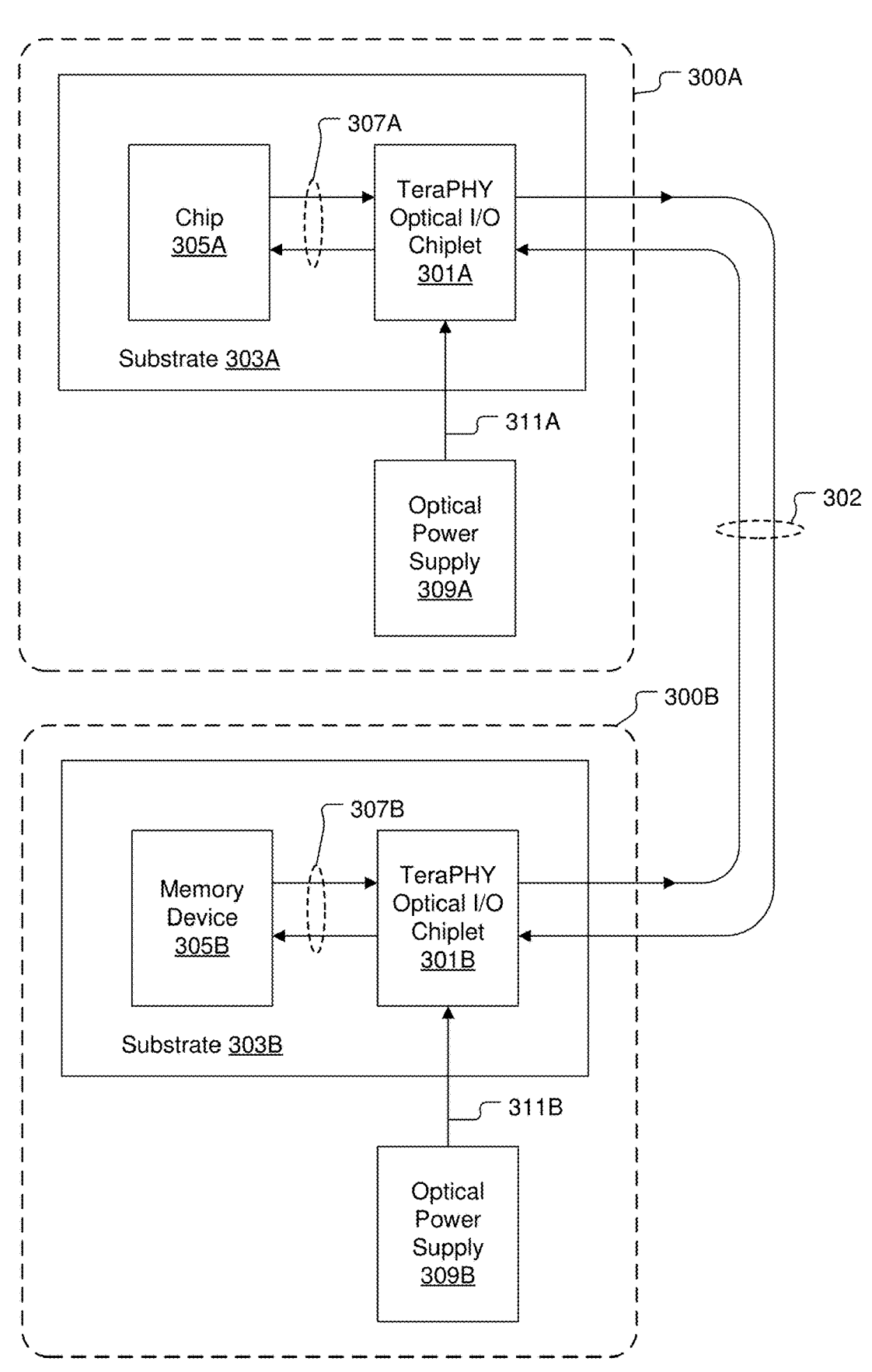
FIG. 11A shows a diagram of a computer system optically connected to a remote memory system through the optical link, in accordance with some embodiments.

FIG. 11A shows a diagram of a computer system 300A optically connected to a remote memory system 300B through the optical link 302, in accordance with some embodiments. In various embodiments, the compute system 300A corresponds to any of the MCP's mentioned herein. It should be understood, however, that in various embodiments the compute system 300A represents essentially any packaged set of semiconductor chips that includes at least one computer chip 305A electrically connected to at least one TeraPHY MIPO I/O chiplet 301A, as indicated by electrical connections/routings 307A. In some embodiments, the at least one computer chip 305A and the at least one TeraPHY MIPO I/O chiplet 301A are packaged on a common substrate 303A. The at least one TeraPHY MIPO I/O chiplet 301A is connected to receive optical power from an optical power supply 309A through one or more optical waveguides 311A. In various embodiments, the at least one TeraPHY MIPO I/O chiplet 301A corresponds to any of the TeraPHY chiplets mentioned herein. The optical power supply 309A is that same as the optical power supply 309 described with regard to FIG. 4A. In various embodiments, the remote memory system 300B corresponds to any of the HBM cards mentioned herein. It should be understood, however, that in various embodiments the remote memory system 300B represents essentially any one or more memory devices 305B electrically connected to at least one TeraPHY MIPO I/O chiplet 301B, as indicated by electrical connections/ routings 307B. In some embodiments, the one or more memory devices 305B and the at least one TeraPHY MIPO I/O chiplet 301B are packaged on a common substrate 303B. The at least one TeraPHY MIPO I/O chiplet 301B is connected to receive optical power from an optical power supply 309B through one or more optical waveguides 311B. In various embodiments, the at least one TeraPHY MIPO I/O chiplet 301B corresponds to any of the TeraPHY chiplets mentioned herein. The optical power supply 309B is that same as the optical power supply 309 described with regard to FIG. 4A. Also, in some embodiments, the optical power supply 309A and 309B are the same optical power supply. The TeraPHY MIPO I/O chiplet 301A of the compute system 300A is optically connected to the TeraPHY MIPO I/O chiplet 301B of the remote memory system 300B through the optical link 302. In some embodiments, the optical link 302 is an optical fiber array.

Figure 11B:
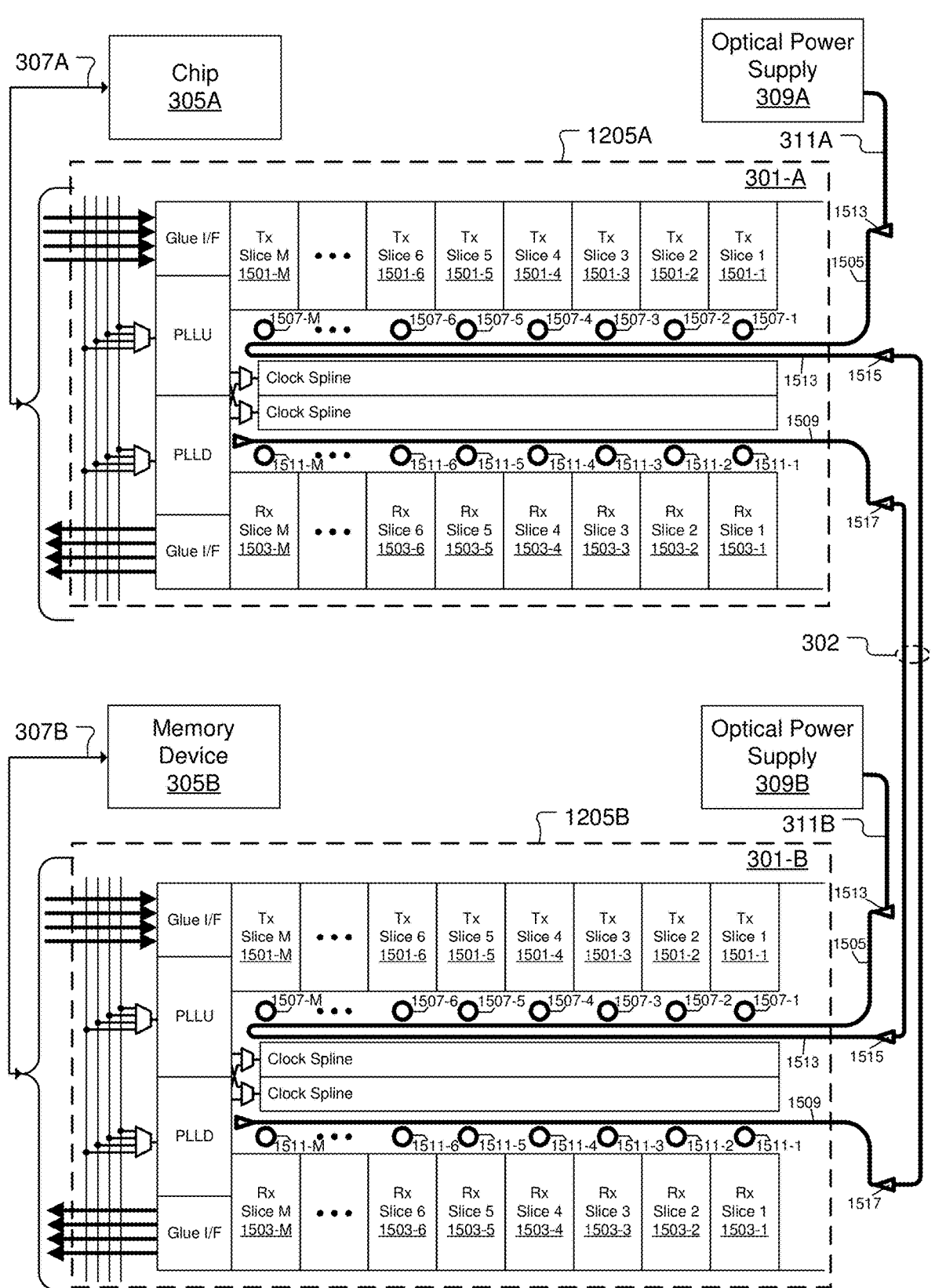
FIG. 11B shows a more detailed view of the optical connections between the TeraPHY MIPO I/O chiplet of the compute system and the TeraPHY MIPO I/O chiplet of the remote memory system, in accordance with some embodiments.

FIG. 11B shows a more detailed view of the optical connections between the TeraPHY MIPO I/O chiplet 301A of the compute system 300A and the TeraPHY MIPO I/O chiplet 301B of the remote memory system 300B, in accordance with some embodiments. In some embodiments, each of the TeraPHY MIPO I/O chiplets 301A and 301B is configured in the same manner as TeraPHY chiplet 1200 described herein. The TeraPHY MIPO I/O chiplet 301A includes at least one optical macro 1205A. The TeraPHY MIPO I/O chiplet 301B includes at least one optical macro 1205B. Each of the optical macros is configured in the same manner as the optical macro 1205-$x$ described herein.

The optical input 1513 of the optical macro 1205A is optically connected to the optical power supply 309A through one or more optical waveguides 311A, e.g., optical fibers. The optical output 1515 of the optical macro 1205A is optically connected to the optical input 1517 of the optical macro 1205B. In this manner, modulated optical signals generated by the transmitter slices 1501-1 through 1501-M of the optical macro 1205A are transmitted to the receiver slices 1503-1 through 1503-M of the optical macro 1205B. In some embodiments, the modulated optical signals generated by the transmitter slices 1501-1 through 1501-M convey instructions for a memory access operation as received by the optical macro 1205B from the chip 305A in the form of electrical signals. The modulated optical signals that convey the instructions for the memory access operation are optically coupled into the optical microring resonators 1511-1 through 1511-M of the optical macro 1205B and are de-modulated by the receiver slices 1503-1 through 1503-M of the optical macro 1205B into electrical signals that are transmitted to the memory device 305B through the electrical connections/routings 307B.

The optical input 1513 of the optical macro 1205B is optically connected to the optical power supply 309B through one or more optical waveguides 311B, e.g., optical fibers. The optical output 1515 of the optical macro 1205B is optically connected to the optical input 1517 of the optical macro 1205A. In this manner, modulated optical signals generated by the transmitter slices 1501-1 through 1501-M of the optical macro 1205B are transmitted to the receiver slices 1503-1 through 1503-M of the optical macro 1205A. In some embodiments, the modulated optical signals generated by the transmitter slices 1501-1 through 1501-M of the optical macro 1205B convey digital data as provided by the memory device 305B through the electrical connections/ routings 307B to the optical macro 1205B, where the digital data results from the memory device 305B performing the memory access operation in accordance with the instructions as received by the optical macro 1205B from the chip 305A in the form of optical signals. The modulated optical signals that convey the digital data as provided by the memory device 305B are optically coupled into the optical microring resonators 1511-1 through 1511-M of the optical macro 1205A and are de-modulated by the receiver slices 1503-1 through 1503-M of the optical macro 1205A into electrical signals that are transmitted to chip 305A through the electrical connections/routings 307A.

Various embodiments are disclosed herein for a remote memory system that includes a substrate of a multi-chip package, an integrated circuit chip connected to the substrate, and an electro-optical chip connected to the substrate. In various embodiments, the substrate is one or more of an interposer and an organic substrate. In various embodiments, the substrate includes both electrically conductive routings and optical waveguides. In various embodiments, the substrate includes a redistribution layer structure, with each of the integrated circuit chip and the electro-optical chip flip-chip connected to the redistribution layer structure. The integrated circuit chip includes a high-bandwidth memory interface. The electro-optical chip has an electrical interface electrically connected to the high-bandwidth memory interface of the integrated circuit chip. The electro-optical chip includes a photonic interface configured to optically connect with an optical link. The electro-optical chip also includes at least one optical macro. Each of the at least one optical macro of the electro-optical chip is configured to convert outgoing electrical data signals received through the electrical interface from the high-bandwidth interface into outgoing optical data signals. Each of the at least one optical macro of the electro-optical chip is configured to transmit the outgoing optical data signals through the photonic interface of the electro-optical chip to the optical link. Each of the at least one optical macro of the electro-optical chip is also configured to convert incoming optical data signals received through the photonic interface of the electro-optical chip from the optical link into incoming electrical data signals. Each of the at least one optical macro of the electro-optical chip is configured to transmit the incoming electrical data signals through the electrical interface of the electro-optical chip to the high-bandwidth memory interface.

The remote memory device includes an electro-optical fanout chip having a photonic interface optically connected to the optical link. The remote memory device includes a high-bandwidth memory stack electrically connected to an electrical interface of the electro-optical fanout chip. In some embodiments, the optical link includes an optical fiber array that optically connects the photonic interface of the electro-optical chip of the multi-chip package to the photonic interface of the electro-optical fanout chip of the remote memory device. In some embodiments, the remote memory device includes a plurality of high-bandwidth memory stacks electrically connected to the electrical interface of the electro-optical fanout chip. In some embodiments, the remote memory device includes a substrate that includes electrical routings, with the electro-optical fanout chip electrically connected to some of the electrical routings in the substrate, and with each of the plurality of high-bandwidth memory stacks electrically connected to some of the electrical routings in the substrate. In some embodiments, the electrical routings in the substrate of the remote memory device form part of a redistribution layer structure, with the electro-optical fanout chip flip-chip connected to the redistribution layer structure, and with each of the plurality of high-bandwidth memory stacks flip-chip connected to the redistribution layer structure. In some embodiments, each of the electro-optical chip of the multi-chip package and the electro-optical fanout chip of the remote memory device is configured to implement wavelength division multiplexing of optical signals through the optical link.

In some embodiments, each of the at least one optical macro of the electro-optical chip includes a plurality of transmitter slices and a plurality of receiver slices. Each transmitter slice of the plurality of transmitter slices includes a corresponding optical microring resonator configured to modulate continuous wave light to convert the outgoing electrical data signals into the outgoing optical data signals. Each receiver slice of the plurality of receiver slices includes a corresponding optical microring resonator configured to optically couple the incoming optical data signals. In some embodiments, the optical microring resonator of the transmitter slice is configured to operate at a specified optical wavelength to modulate continuous wave light having the specified optical wavelength so as to convert the outgoing electrical data signals into the outgoing optical data signals having the specified optical wavelength. Also, the optical microring resonator of the receiver slice is configured to operate at the specified optical wavelength to optically couple the incoming optical data signals having the specified optical wavelength.

In some embodiments, at least one additional electro-optical chip is connected to the substrate of the multi-chip package. Each of the at least one additional electro-optical chip has a corresponding electrical interface electrically connected to the integrated circuit chip of the multi-chip package. Also, each of the at least one additional electro-optical chip has a corresponding photonic interface optically connected to a first end of a corresponding optical link. In some embodiments, each optical link has a second end optically connected to a separate electro-optical fanout chip of a separate remote memory device. In some embodiments, each remote memory device includes at least one high-bandwidth memory stack electrically connected to the electro-optical fanout chip of the remote memory device.

Figure 12:
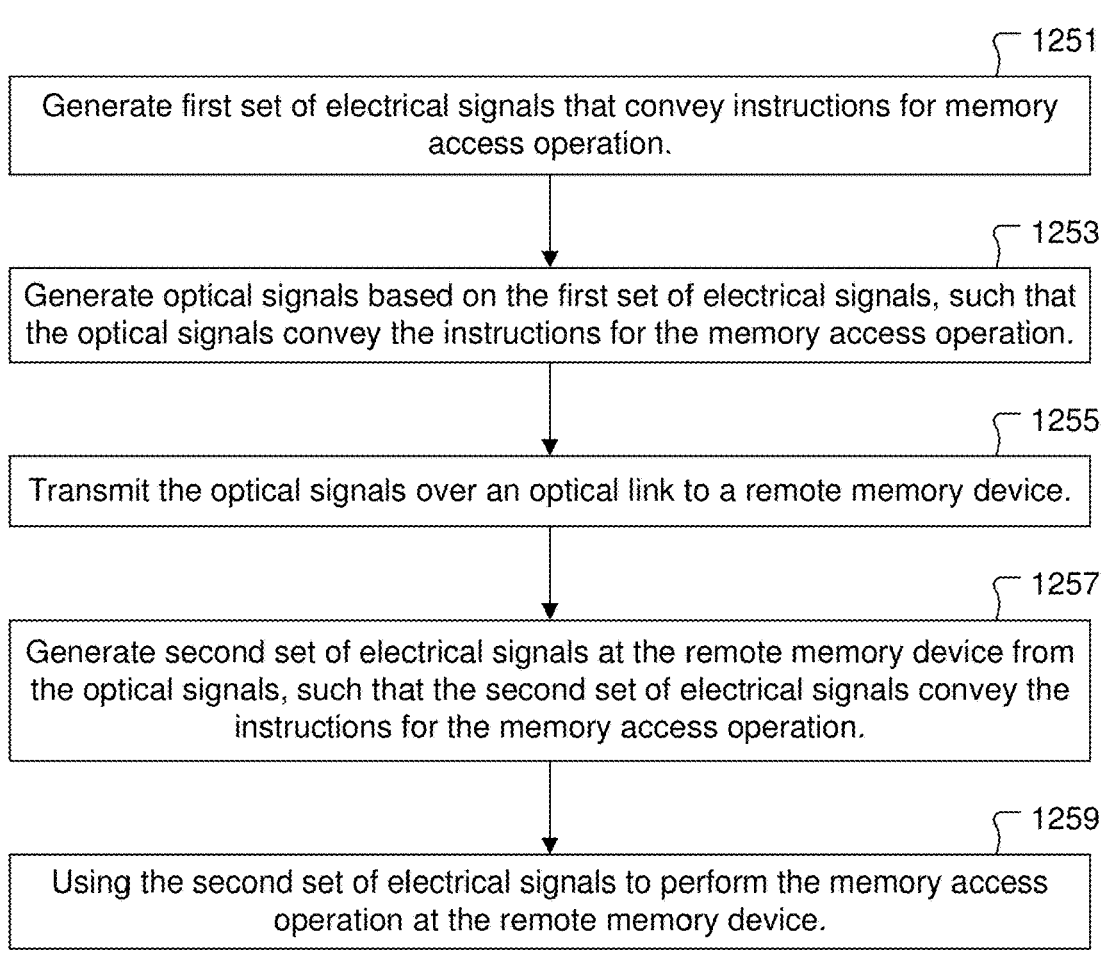
FIG. 12 shows a flowchart of a method for operating a remote memory system, in accordance with some embodiments.

FIG. 12 shows a flowchart of a method for operating a remote memory system, in accordance with some embodiments. The method includes an operation 1251 for generating a first set of electrical data signals that convey instructions for a memory access operation. In some embodiments, the memory access operation is a high-bandwidth memory access operation. The method also includes an operation 1253 for generating optical data signals based on the first set of electrical data signals. The optical data signals convey the instructions for the memory access operation. The method also includes an operation 1255 for transmitting the optical data signals over an optical link to a remote memory device. The remote memory device is physically separate from a computing device on which the first set of electrical data signals is generated. The method also includes an operation 1257 for generating a second set of electrical data signals at the remote memory device from the optical data signals. The second set of electrical data signals convey the instructions for the memory access operation. The method also includes an operation 1259 for using the second set of electrical data signals to perform the memory access operation at the remote memory device.

In some embodiments, the method includes transmitting the first set of electrical data signals through a high-bandwidth memory interface to an electrical interface of a first electro-optical chip. The method also includes operating the first electro-optical chip to generate the optical data signals based on the first set of electrical data signals. The method also includes operation the first electro-optical chip to transmit the optical data signals over the optical link. In some embodiments, operating the first electro-optical chip to generate the optical data signals includes operating at least one optical microring resonator of a plurality of optical microring resonators on the first electro-optical chip to modulate continuous wave light having a specified optical wavelength to convert the first set of electrical data signals into the optical data signals having the specified optical wavelength.

In some embodiments, the method includes receiving the optical data signals from the optical link through a photonic interface of a second electro-optical chip on the remote memory device. The method also includes operating the second electro-optical chip to generate the second set of electrical data signals from the received optical data signals. In some embodiments, the method includes operating the second electro-optical chip to transmit the second set of electrical data signals through an electrical interface of the second electro-optical chip to a high-bandwidth memory stack on the remote memory device. The method also includes operating the high-bandwidth memory stack to use the second set of electrical data signals to perform the memory access operation within the high-bandwidth memory stack. In some embodiments, operating the second electro-optical chip to generate the second set of electrical data signals includes operating at least one optical microring resonator of a plurality of optical microring resonators on the second electro-optical chip to optically couple the optical data signals received through the photonic interface of the second electro-optical chip. The optically coupled optical data signals are conveyed to a photodetector device electrically connected to de-modulation circuitry on the second electro-optical chip. The de-modulation circuitry operates to generate the second set of electrical data signals based on the optical data signals as conveyed to the photodetector device.

Figure 13:
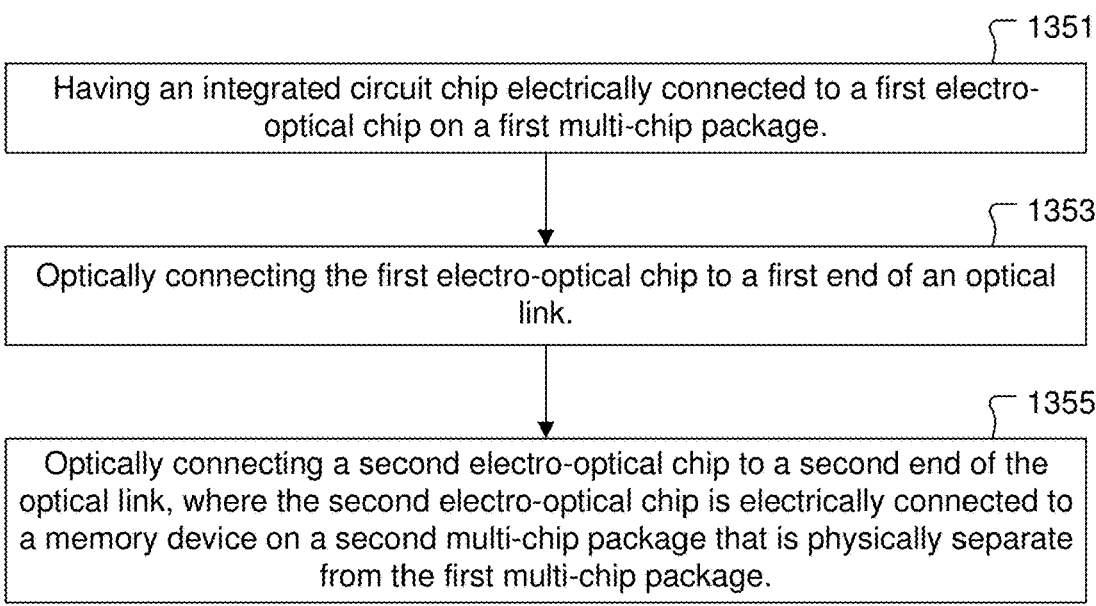
FIG. 13 shows a flowchart of a method for configuring a remote memory system, in accordance with some embodiments.

FIG. 13 shows a flowchart of a method for configuring a remote memory system, in accordance with some embodiments. The method includes an operation 1351 for having an integrated circuit chip electrically connected to a first electro-optical chip on a first multi-chip package. The method also includes an operation 1353 for optically connecting the first electro-optical chip to a first end of an optical link. In some embodiments, the optical link is formed as an optical fiber array. The method also includes an operation 1355 for optically connecting a second electro-optical chip to a second end of the optical link. The second electro-optical chip is electrically connected to a memory device on a second multi-chip package that is physically separate from the first multi-chip package. In some embodiments, the memory device is a high-bandwidth memory stack.

In some embodiments, the method also includes flip-chip connecting the integrated circuit chip to a redistribution layer structure within a substrate of the first multi-chip package. Also, in some embodiments, the method includes flip-chip connecting the first electro-optical chip to the redistribution layer structure within the substrate of the first multi-chip package. In some embodiments, the method includes flip-chip connecting the second electro-optical chip to a redistribution layer structure within a substrate of the second multi-chip package. Also, in some embodiments, the method includes flip-chip connecting the memory device to the redistribution layer structure within the substrate of the second multi-chip package.

In some embodiments, the first electro-optical chip includes at least one optical macro. Each of the at least one optical macro of the first electro-optical chip is configured to convert outgoing electrical data signals received from the integrated circuit chip into outgoing optical data signals and transmit the outgoing optical data signals through the optical link. Each of the at least one optical macro of the first electro-optical chip is configured to convert incoming optical data signals received through the optical link into incoming electrical data signals and transmit the incoming electrical data signals to the integrated circuit chip. In some embodiments, the second electro-optical chip includes at least one optical macro. Each of the at least one optical macro of the second electro-optical chip is configured to convert incoming optical data signals received through the optical link into incoming electrical data signals and transmit the incoming electrical data signals to the memory device. Each of the at least one optical macro of the second electro-optical chip is configured to convert outgoing electrical data signals received from the memory device into outgoing optical data signals and transmit the outgoing optical data signals through the optical link.

Figure 14:
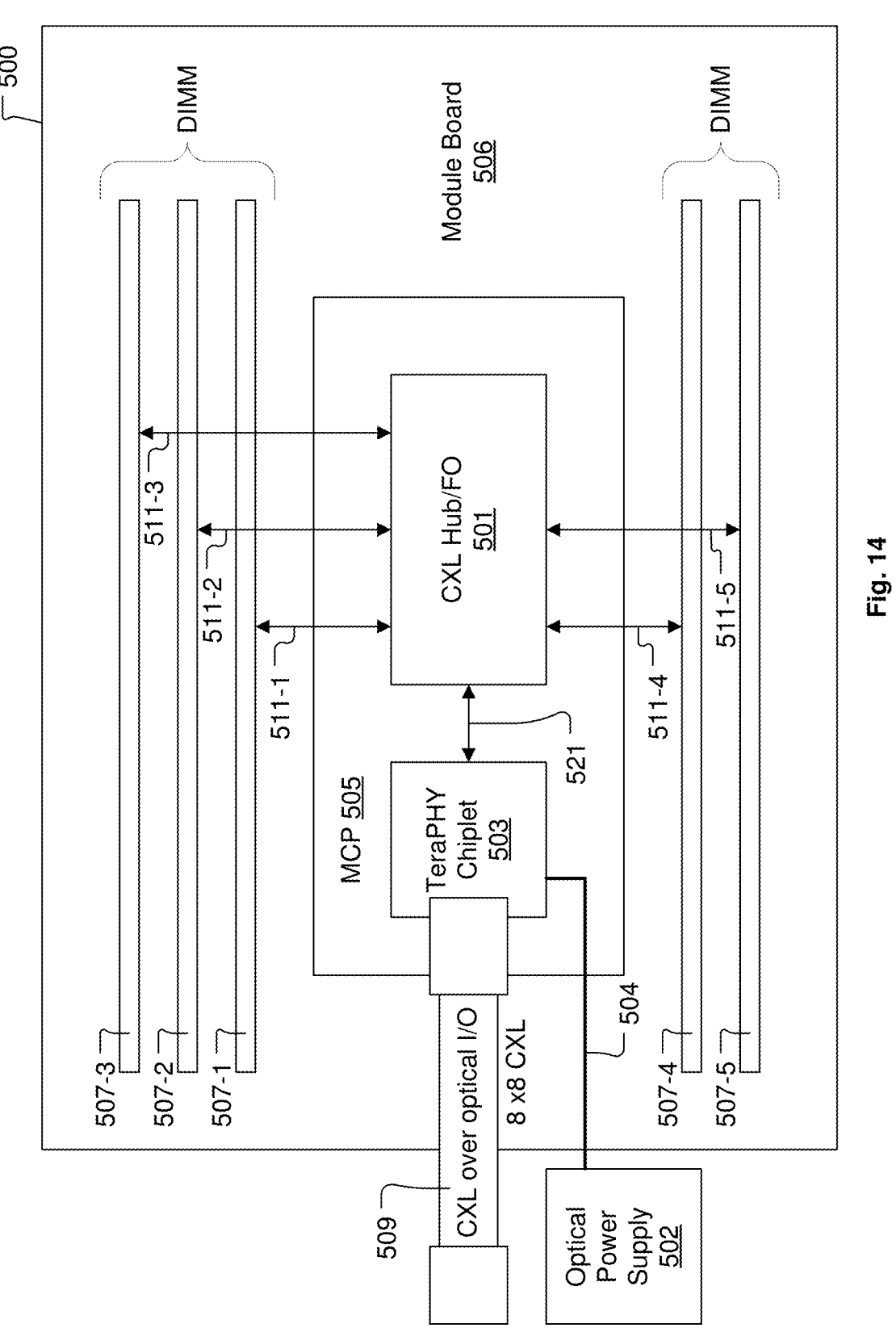
FIG. 14 shows a diagram of a CXL-connected DRAM module implemented using a TeraPHY chiplet and a CXL Hub/FO (fanout) chip on an MCP, in accordance with some embodiments.

FIG. 14 shows a diagram of a Compute Express Link (CXL)-connected DRAM module 500 implemented using a TeraPHY chiplet 503 and a CXL Hub/FO (fanout) chip 501 on an MCP 505, in accordance with some embodiments. The TeraPHY chiplet 503 is an electro-optical chip as described herein. The CXL Hub/FO (fanout) chip 501 is an electrical fanout chip. The CXL protocol is an open standard interconnection protocol for high-speed data communication between a processor and device/memory. The CXL protocol is built upon the PCIe physical and electrical interface, and provides protocols with regard to input/output (I/O), memory, and cache coherence. The TeraPHY chiplet 503 is optically connected through an optical fiber array 509 to an optical fiber network over which data is optically transmitted to and from the TeraPHY chiplet 503. An optical power supply 502 is optically connected to the TeraPHY chiplet 503 through one or more optical waveguides 504, such as optical fiber(s). The optical power supply 502 is configured to generate continuous wave light (laser light of one or more controlled/specified wavelength(s)) and supply the continuous wave light to the plurality of transmitter slices 1501-1 through 1501-M of the at least one optical macro 1205-$x$ within the TeraPHY chiplet 503. The TeraPHY chiplet 503 is electrically connected to the CXL Hub/FO 501, as indicated by arrow 521, to enable bi-directional data communication between the TeraPHY chiplet 503 and the CXL Hub/FO 501.

In some embodiments, the MCP 505 is implemented using an organic substrate and/or 2.5D packaging technology. In some embodiments, the TeraPHY chiplet 503 and the CXL Hub/FO 501 are placed either next to each other or at least partially on top of each other. In some embodiments, the TeraPHY chiplet 503 and the CXL Hub/FO 501 are implemented as separate chips, such as shown in FIG. 14. However, in some embodiments, TeraPHY chiplet 503 and the CXL Hub/FO 501 are integrated together in a single chip that is disposed within the MCP 505. The MCP 505 is disposed on a module board 506, such as a printed circuit board (PCB). In some embodiments, the optical power supply 502 is physically separate from the module board 506. In some embodiments, the optical power supply 502 is disposed on the module board 506. The module board 506 includes a number of dual in-line memory module (DIMM) slots (5 in the example of FIG. 14) into which respectively DRAM DIMM's 507-1 through 507-5 are installed. In various embodiments, the DRAM module 500 can include any number (N) of DRAM DIMM's 507-1 through 507-N. In some embodiments, such as shown in FIG. 14, the DRAM module 500 includes five DRAM DIMM's 507-1 through 507-5. In another embodiment, the DRAM module 500 includes ten DRAM DIMM's 507-1 through 507-5.

The CXL Hub/FO chip 501 is electrically connected to each of the DIMM slots to enable bi-directional data communication with each of the DRAM DIMM's 507-1 through 507-5, as indicated by arrows 511-1 through 511-5, respectively. In this manner, data that is to be written into memory is electrically communicated from the TeraPHY chiplet 503, through the CXL Hub/FO 501, to any one or more of the DRAM DIMM's 507-1 through 507. And, data that is to be read from memory is electrically communicated from any one or more of the DRAM DIMM's 507-1 through 507, through the CXL Hub/FO 501, to the TeraPHY chiplet 503. The TeraPHY chiplet 503 functions to provide a data interface between the electrical domain (of the CXL Hub/FO 501, MCP 505, module board 506 and DRAM DIMM's 507-1 through 507-5) and the optical domain of the optical network over which data is communicated to and/or from the CXL-connected DRAM module 500.

The CXL Hub/FO chip 501 is configured to arbitrate access to DRAM channels from CXL lanes. Each optical link with x8 CXL lanes can be connected between a different source and the TeraPHY chiplet 503 through the optical fiber array 509. In some embodiments, the TeraPHY chiplet 503 is a 2.048 Terabit per second (Tbps) chip. For example, in some embodiments, the TeraPHY chiplet 503 is configured to support eight x8 CXL lanes at 32 Gbps (Gigabits per second), which corresponds to the TeraPHY chiplet 503 supporting 2.048 Tbps, i.e., (8) (8 CXL lanes) (32 Gbps) =2.048 Tbps. In some embodiments, the DRAM module 500 includes five DDR5 DIMM channels, with the TeraPHY chiplet 503 interfaced to support the five DDR5 DIMM channels. In some embodiments, each DDR5 DIMM channel is 64 bits per channel and operates at 6.4 Gigatransfers per second (GT/s). Therefore, in such embodiments, each DDR5 DIMM channel operates at a data rate of 409.6 Gbps, i.e., (6.4 GT/s) (64 bits/channel/transfer)=409.6 Gbps/channel. Therefore, in such embodiments, the five DDR5 DIMM channels collectively operate at a combined data rate of 2.048 Tbps, i.e., (5 channels) (409.6 Gbps/channel)=2.048 Tbps.

Figure 15:
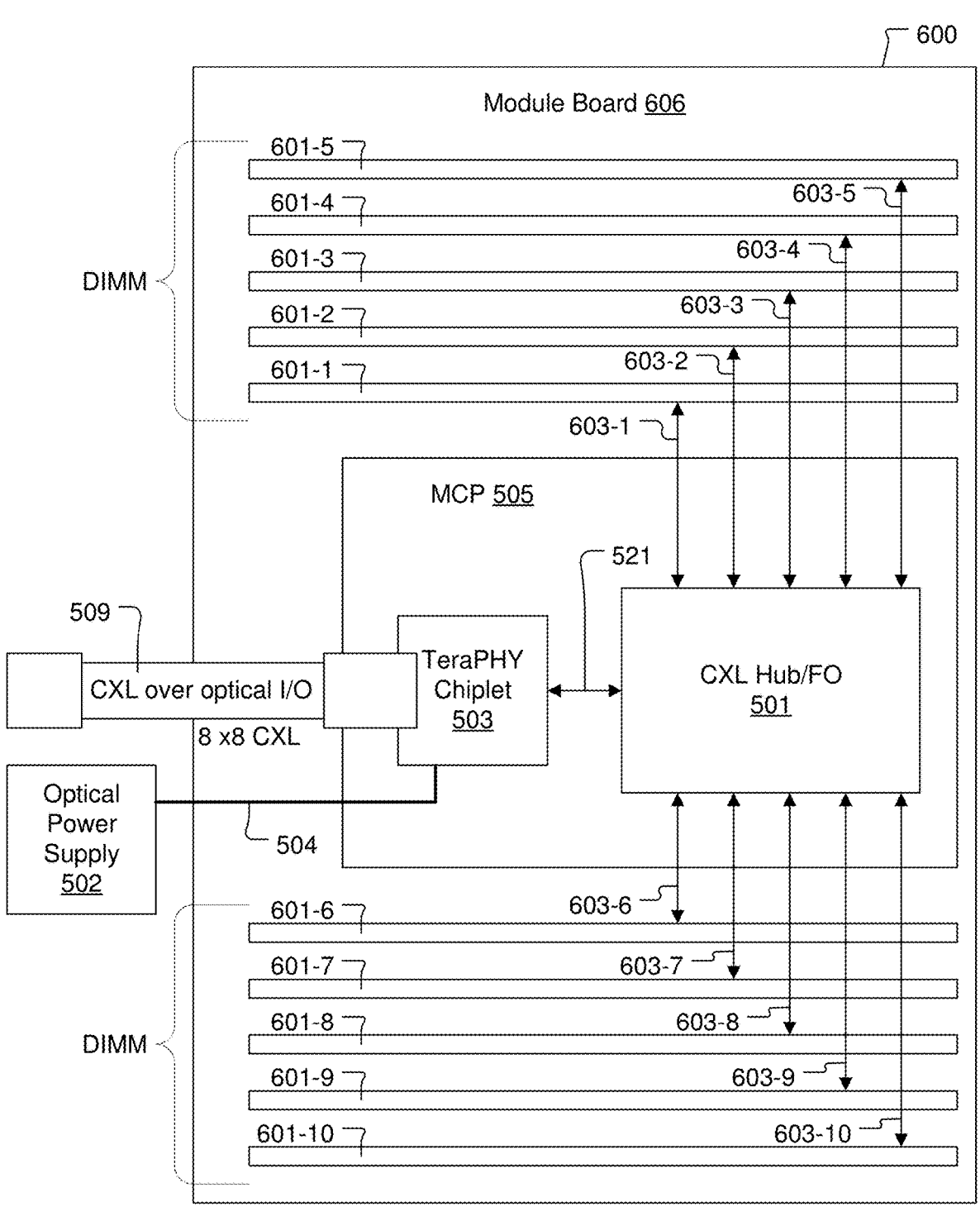
FIG. 15 shows a CXL-connected DRAM module that supports ten DIMM channels, in accordance with some embodiments.

FIG. 15 shows a CXL-connected DRAM module 600 that supports ten DIMM channels, in accordance with some embodiments. The DRAM module 600 is a variation of the DRAM module 500 of FIG. 14. The DRAM module 600 includes a module board 606, such as a PCB, on which the MCP 505 is disposed, where the MCP 505 includes the TeraPHY chiplet 503 and the CXL Hub/FO chip 501. The module board 606 includes ten DIMM slots into which respective DRAM DIMM's 601-1 through 601-10 are installed. The CXL Hub/FO chip 501 is electrically connected to each of the DIMM slots to enable electrical data communication with each of the DRAM DIMM's 601-1 through 601-10, as indicated by arrows 603-1 through 603-10, respectively.

In some embodiments, each DIMM channel corresponding to the ten DRAM DIMM's 601-1 through 601-10 is a 64 bit DDR4 DIMM channel operating at 3.2 GT/s. Therefore, in such embodiments, each DDR4 DIMM channel operates at a data rate of 204.8 Gbps, i.e., (3.2 GT/s) (64 bits/channel/transfer)=204.8 Gbps/channel. Therefore, in such embodiments, the ten DDR4 DIMM channels collectively operate at a combined data rate of 2.048 Tbps, i.e., (10 channels) (204.8 Gbps/channel)=2.048 Tbps. By way of example, with the DRAM module 600 configured to support ten DDR4 DIMM channels as discussed above, the CXL-connected DRAM module 600 can be used to provide over-optical CXL I/O support for the I/O hub (controller die) on the "Rome" multi-chip module of AMD's second generation EPYC processor family, which has eight DDR4 memory channels. It should be understood, that the CXL-connected DRAM modules 500 and 600 of FIGS. 14 and 15, respectively, are provided by way of example. In other embodiments, the MCP 505, including the TeraPHY chiplet 503 and the CXL Hub/FO chip 501, is implementable in a DRAM module configuration that supports any number of DIMM channels in order to provide over-optical remote pooled DRAM memory for a processor and/or computing device.

Figure 16:
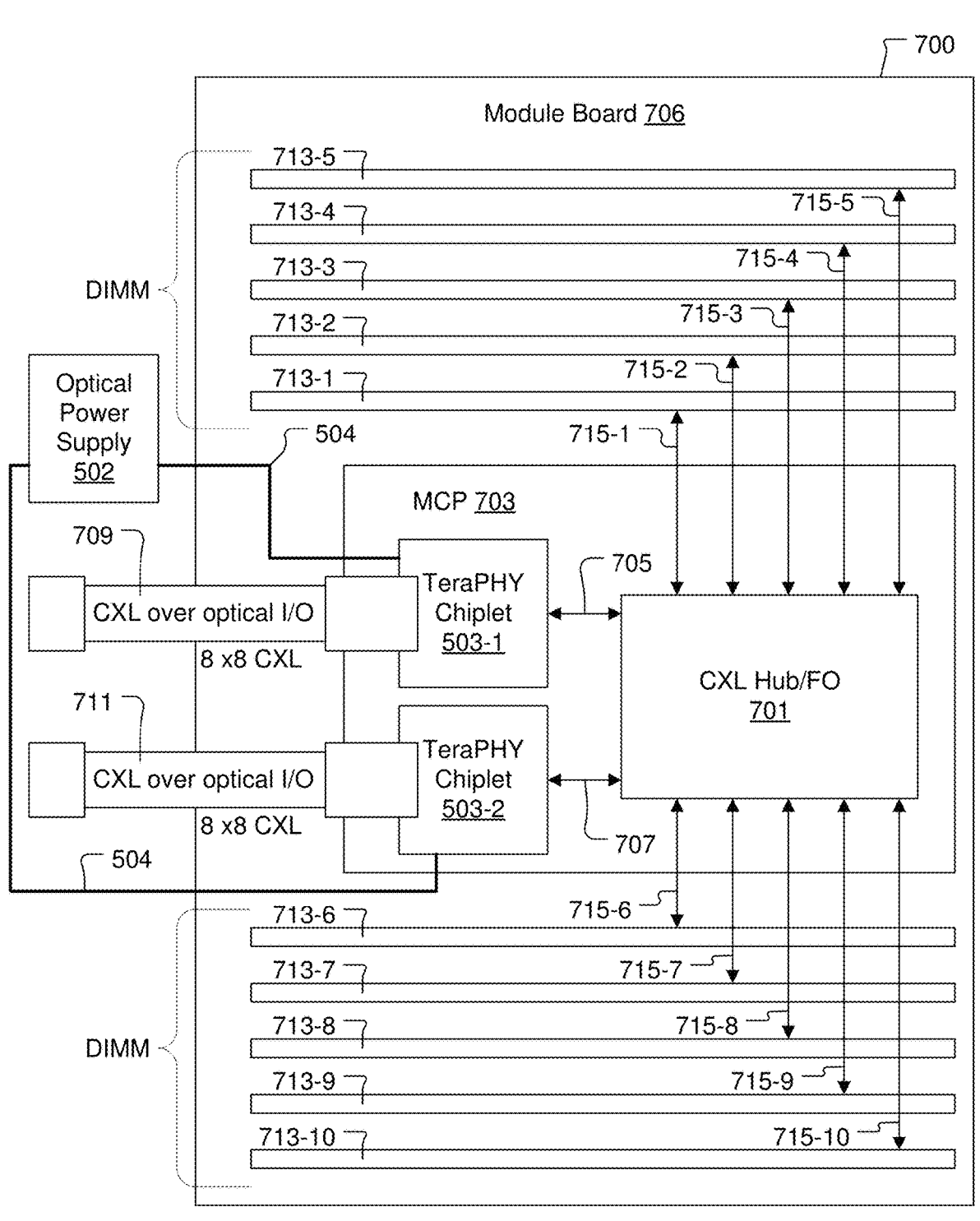
FIG. 16 shows another CXL-connected DRAM module that supports ten DIMM channels, in accordance with some embodiments.

FIG. 16 shows another CXL-connected DRAM module 700 that supports ten DIMM channels, in accordance with some embodiments. The DRAM module 700 is a variation of the DRAM module 600 of FIG. 15. The DRAM module 700 includes a module board 706, such as a PCB, on which an MCP 703 is disposed. The MCP 703 includes a first TeraPHY chiplet 503-1 in bi-directional electrical data communication with a CXL Hub/FO 701, as indicated by arrow 705. The first TeraPHY chiplet 503-1 is connected to an optical network through an optical fiber array 709. The MCP 703 also includes a second TeraPHY chiplet 503-2 in bi-directional electrical data communication with the CXL Hub/FO 701, as indicated by arrow 707. Each of the first TeraPHY chiplet 503-1 and the second TeraPHY chiplet 503-2 is optically connected to the optical power supply 502 through one or more optical waveguides 504, such as optical fiber(s). The second TeraPHY chiplet 503-2 is connected to an optical network through an optical fiber array 711. The module board 706 includes ten DIMM slots into which respectively DRAM DIMM's 713-1 through 713-10 are installed. The CXL Hub/FO chip 701 is electrically connected to each of the DIMM slots to enable electrical data communication with each of the DRAM DIMM's 713-1 through 713-10, as indicated by arrows 715-1 through 715-10, respectively. The CXL Hub/FO chip 701 is configured to enable each of the TeraPHY chiplets 503-1 and 503-2 to access each of the ten DRAM DIMM's 713-1 through 713-10.

In some embodiments, the MCP 703 is implemented using an organic substrate and/or 2.5D packaging technology. In some embodiments, the first TeraPHY chiplet 503-1 and the CXL Hub/FO 701 are placed either next to each other or at least partially on top of each other. In some embodiments, the second TeraPHY chiplet 503-2 and the CXL Hub/FO 701 are placed either next to each other or at least partially on top of each other. In some embodiments, the first and second TeraPHY chiplets 503-1 and 503-2 are implemented as separate chips, such as shown in FIG. 16. In some embodiments, the first and second TeraPHY chiplets 503-1 and 503-2 are integrated together in a single chip that is disposed within the MCP 703. In some embodiments, the first and second TeraPHY chiplets 503-1 and 503-2 and the CXL Hub/FO chip 701 are implemented as separate chips, such as shown in FIG. 16. In some embodiments, the first and second TeraPHY chiplets 503-1 and 503-2 and the CXL Hub/FO chip 701 are integrated together in a single chip that is disposed within the MCP 703.

In some embodiments, the DRAM module 700 configuration of FIG. 16 is able to provide double the data rate of the DRAM module 500 configuration of FIG. 14. In some embodiments, each of the TeraPHY chiplets 503-1 and 503-2 is configured to support eight x8 CXL lanes at 32 Gbps, which corresponds to each of the TeraPHY chiplets 503-1 and 503-2 supporting 2.048 Tbps, i.e., (8) (8 CXL lanes) (32 Gbps)=2.048 Tbps. Therefore, in some embodiments, each of the TeraPHY chiplets 503-1 and 503-2 is a 2.048 Tbps chip, which enables the DRAM module 700 to support a total data rate of up to 4.096 Tbps. In some embodiments, each of the DRAM DIMM's 713-1 through 713-10 provides a 64 bit DDR5 DIMM channel operating at 6.4 GT/s. Therefore, in such embodiments, each DDR5 DIMM channel operates at a data rate of 409.6 Gbps, i.e., (6.4 GT/s) (64 bits/channel/transfer)=409.6 Gbps/channel. Therefore, in such embodiments, the ten DDR5 DIMM channels collectively operate at a combined data rate of up to 4.096 Tbps, i.e., (10 channels) (409.6 Gbps/channel) =4.096 Tbps.

Figure 17:
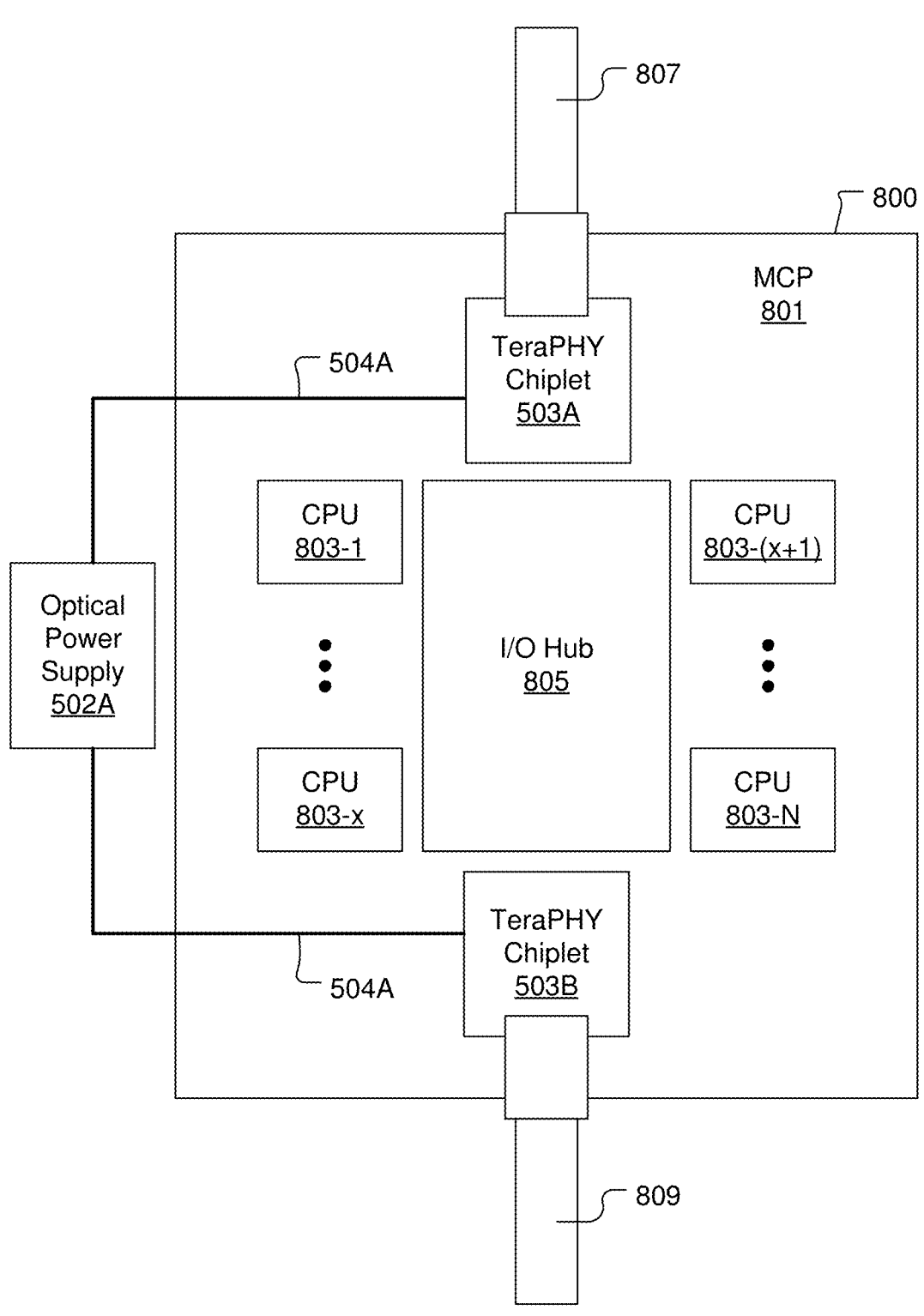
FIG. 17 shows an example of a computing device configured to interface with either of the example CXL-connected DRAM modules, as described with regard to FIGS. 14, 15, and 16, respectively, in accordance with some embodiments.

FIG. 17 shows an example of a computing device 800 configured to interface with either of the example CXL-connected DRAM modules 500, 600, and 700, as described with regard to FIGS. 14, 15, and 16, respectively, in accordance with some embodiments. The computing device 800 includes an MCP 801 in which a number (N) of processors 803-1 through 803-N are disposed. A first TeraPHY chiplet 503A and second TeraPHY chiplet 503B are also disposed within the MCP 801. Each of the first TeraPHY chiplet 503A and the second TeraPHY chiplet 503B is optically connected to an optical power supply 502A through one or more optical waveguides 504A, such as optical fiber(s). The optical power supply 502A is configured to generate continuous wave light (laser light of one or more controlled/specified wavelength(s)) and supply the continuous wave light to the plurality of transmitter slices 1501-1 through 1501-M of the at least one optical macro 1205-*x* within each of the first TeraPHY chiplet 503A and the second TeraPHY chiplet 503B. In some embodiments, each of the TeraPHY chiplets 503A and 503B carries x64 PCIe lanes (Gen4 of Gen5). An I/O Hub chip 805 is also disposed within the MCP 801. In some embodiments, the I/O Hub chip 805 is an I/O controller chip configured to implement the CXL protocol. In some embodiments, the MCP 801 is implemented using 2.5D packaging technology. In some embodiments, the MCP 801 includes an RDL for electrically connecting the processors 803-1 through 803-N to the I/O Hub 805, and for connecting the TeraPHY chiplets 503A and 503B to the I/O Hub 805. In some embodiments, one or more of the processors 803-1 through 803-N is/are electrically connected to the I/O Hub 805 through a BGA or other similar connection technology. In some embodiments, one or both of the TeraPHY chiplets 503A and 503B is/are electrically connected to the I/O Hub 805 through a BGA or other similar connection technology. In some embodiments, the MCP 801 includes a single TeraPHY chiplet. In some embodiments, the MCP 801 includes more than two TeraPHY chiplets. In some embodiments, one or more of the processors 803-1 through 803-N and TeraPHY chiplets 503A, 503B are positioned next to the I/O Hub 805 within the MCP 801. In some embodiments, one or more of the processors 803-1 through 803-N and TeraPHY chiplets 503A, 503B are positioned to at least partially overlap the I/O Hub 805 within the MCP 801.

The I/O Hub is configured to provide for bi-directional data communication between each of the processors 803-1 through 803-N and each of the TeraPHY chiplets 503A and 503B, such that any of the processors 803-1 through 803-N is able to transmit data through any of the TeraPHY chiplets 503A and 503B. The TeraPHY chiplet 503A is optically connected through an optical fiber array 807 to an optical fiber network over which data is optically transmitted to and from the TeraPHY chiplet 503A. The TeraPHY chiplet 503B is optically connected through an optical fiber array 809 to an optical fiber network over which data is optically transmitted to and from the TeraPHY chiplet 503B. Each of the TeraPHY chiplets 503A and 503B functions to provide a data interface between the electrical domain of the computing device 800 and the optical domain of the optical network over which data is communicated to and/or from the computing device 800. It should be understood that the computing device 800 is provided by way of example. In other embodiments, the computing device 800 can be configured in other ways, so long as the computing device 800 includes at least one TeraPHY chiplets for providing a data interface between the electrical and optical domains.

Figure 18:
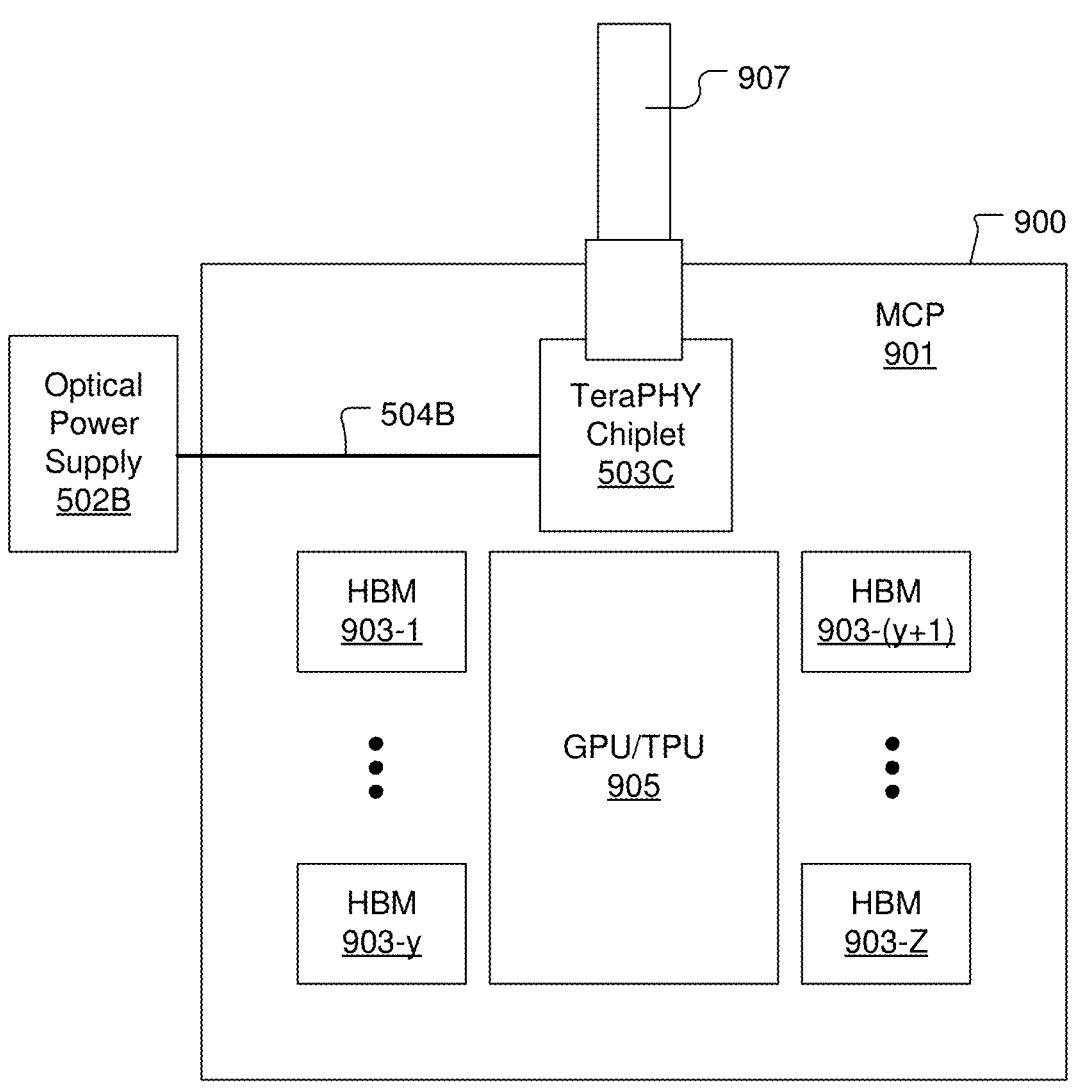
FIG. 18 shows another example of a computing device configured to interface with either of the example CXL-connected DRAM modules, as described with regard to FIGS. 14, 15, and 16, respectively, in accordance with some embodiments.

FIG. 18 shows another example of a computing device 900 configured to interface with either of the example CXL-connected DRAM modules 500, 600, and 700, as described with regard to FIGS. 14, 15, and 16, respectively, in accordance with some embodiments. The computing device 900 includes an MCP 901 in which a processing unit 905 is disposed. In some embodiments, the processing unit 905 is a graphics processing unit (GPU). In some embodiments, the processing unit 905 is a tensor processing unit (TPU). However, it should be understood that in various embodiments, the processing unit 905 can be any type of computer processing unit. A number (N) of HBM stacks 903-1 through 903-N are also disposed within the MCP 901. A TeraPHY chiplet 503C is also disposed within the MCP 901. The TeraPHY chiplet 503C is optically connected to an optical power supply 502B through one or more optical waveguides 504B, such as optical fiber(s). The optical power supply 502B is configured to generate continuous wave light (laser light of one or more controlled/specified wavelength(s)) and supply the continuous wave light to the plurality of transmitter slices 1501-1 through 1501-M of the at least one optical macro 1205-x within the TeraPHY chiplet 503C. In some embodiments, the TeraPHY chiplet 503C carries x64 PCIe lanes (Gen4 of Gen5). In some embodiments, the processing unit 905 is configured to implement the CXL protocol. In some embodiments, the MCP 901 is implemented using 2.5D packaging technology. In some embodiments, the MCP 901 includes an RDL for electrically connecting the HBM stacks 903-1 through 903-N to the processing unit 905, and for connecting the TeraPHY chiplet 503C to the processing unit 905. In some embodiments, one or more of the HBM stacks 903-1 through 903-N is/are electrically connected to the processing unit 905 through a BGA or other similar connection technology. In some embodiments, the TeraPHY chiplet 503C is electrically connected to the processing unit 905 through a BGA or other similar connection technology. In some embodiments, the MCP 901 includes more than one TeraPHY chiplet. In some embodiments, one or more of the HBM stacks 903-1 through 903-N and the TeraPHY chiplet 503C is/are positioned next to the processing unit 905 within the MCP 901. In some embodiments, one or more of the HBM stacks 903-1 through

903-N and the TeraPHY chiplet 503C is/are positioned to at least partially overlap the processing unit 905 within the MCP 901.

The processing unit 905 is connected in bi-directional data communication with each of the HBM stacks 903-1 through 903-N and with the TeraPHY chiplet 503C. The TeraPHY chiplet 503C is optically connected through an optical fiber array 907 to an optical fiber network over which data is optically transmitted to and from the TeraPHY chiplet 503C. The TeraPHY chiplet 503C functions to provide a data interface between the electrical domain of the computing device 900 and the optical domain of the optical network over which data is communicated to and/or from the computing device 900. It should be understood that the computing device 900 is provided by way of example. In other embodiments, the computing device 900 can be configured in other ways, so long as the computing device 900 includes at least one TeraPHY chiplet for interfacing between the electrical and optical domains.

Figure 19:
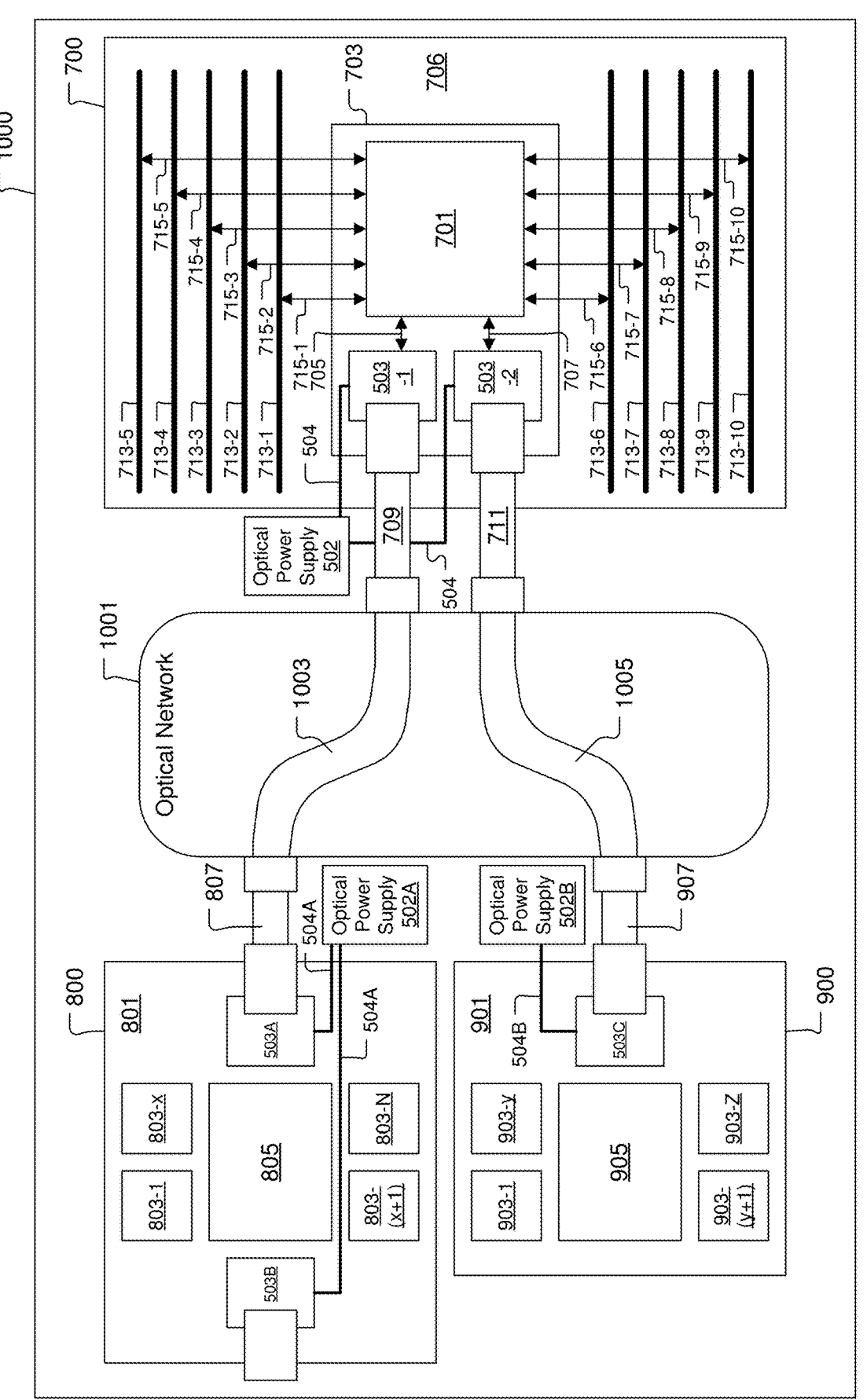
FIG. 19 shows an example optical data communication system in which the computing module of FIG. 17 and the computing module of FIG. 18 are connected in over-optical data communication with the remote DRAM module of FIG. 16, in accordance with some embodiments.

FIG. 19 shows an example optical data communication system 1000 in which the computing module 800 of FIG. 17 and the computing module 900 of FIG. 18 are connected in over-optical data communication with the remote DRAM module 700 of FIG. 16, in accordance with some embodiments. The optical fiber array 807 of the computing module 800 is connected to a first end of an optical fiber link 1003 within an optical network 1001. A second end of the optical fiber link 1003 is connected to the optical fiber array 709 of the DRAM module 700. The optical fiber array 907 of the computing module 900 is connected to a first end of an optical fiber link 1005 within the optical network 1001. A second end of the optical fiber link 1005 is connected to the optical fiber array 711 of the DRAM module 700. In various embodiments, each of the optical links 1003 and 1005 can include optical fibers, optical fiber arrays, optical waveguides, light wave circuits, and any number and type of active and/or passive optical devices, such as optical splitters, optical combiners, optical amplifiers, among others. Each of the I/O Hub 805, the processing unit 905, and the CXL Hub/FO 701 is configured to implement the CXL protocol. Therefore, the configuration of FIG. 19 shows an example of an optical data communication system that uses the CXL protocol between a remote pooled DRAM system within the DRAM module 700 and multiple different type of computing devices 800 and 900. It should be understood that the optical data communication system 1000 of FIG. 19 is provided by way of example and represents one of essentially any number and type of optical data communication system configurations in which the TeraPHY chiplet technology is leveraged to provide for over-optical data communication between a remote memory system (e.g., pooled DRAM system) and one or more processing device(s), using advanced data communication protocols, such as the CXL protocol.

Figure 20:
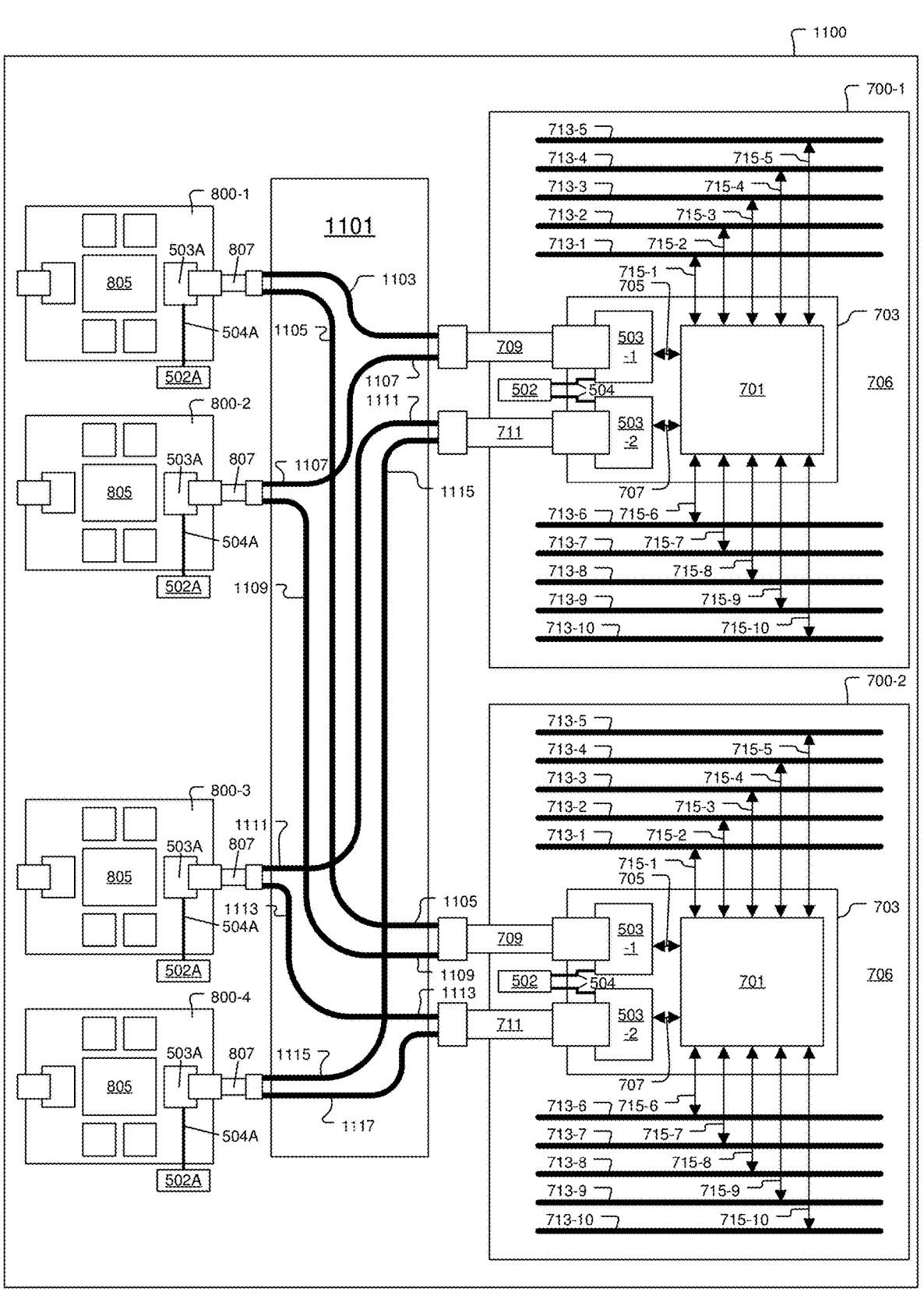
FIG. 20 shows an example optical data communication system in which multiple instances of the computing module of FIG. 17 are connected in over-optical data communication with multiple instances of the remote DRAM module of FIG. 16, in accordance with some embodiments.

FIG. 20 shows an example optical data communication system 1100 in which multiple instances 800-1 through 800-4 of the computing module 800 of FIG. 17 are connected in over-optical data communication with multiple instances 700-1 and 700-2 of the remote DRAM module 700 of FIG. 16, in accordance with some embodiments. A first portion of the optical fiber array 807 of the first computing module instance 800-1 is connected to a first end of an optical fiber link 1103 within an optical network 1101. In some embodiments, the first portion of the optical fiber array 807 of the first computing module instance 800-1 is one-third of the optical fibers within the optical fiber array 807. In some embodiments, the optical network 1101 is implemented as an optical fiber shuffle or optical fiber loom. A second end of the optical fiber link 1103 is connected to a first portion of the optical fiber array 709 of the first DRAM module instance 700-1. In some embodiments, the first portion of the optical fiber array 709 of the first DRAM module instance 700-1 is one-third of the optical fibers within the optical fiber array 709. A second portion of the optical fiber array 807 of the first computing module instance 800-1 is connected to a first end of an optical fiber link 1105 within the optical network 1101. In some embodiments, the second portion of the optical fiber array 807 of the first computing module instance 800-1 is one-third of the optical fibers within the optical fiber array 807. A second end of the optical fiber link 1105 is connected to a first portion of the optical fiber array 709 of the second DRAM module instance 700-2. In some embodiments, the first portion of the optical fiber array 709 of the second DRAM module instance 700-2 is one-third of the optical fibers within the optical fiber array 709.

A first portion of the optical fiber array 807 of the second computing module instance 800-2 is connected to a first end of an optical fiber link 1107 within the optical network 1101. In some embodiments, the first portion of the optical fiber array 807 of the second computing module instance 800-2 is one-third of the optical fibers within the optical fiber array 807. A second end of the optical fiber link 1107 is connected to a second portion of the optical fiber array 709 of the first DRAM module instance 700-1. In some embodiments, the second portion of the optical fiber array 709 of the first DRAM module instance 700-1 is one-third of the optical fibers within the optical fiber array 709. A second portion of the optical fiber array 807 of the second computing module instance 800-2 is connected to a first end of an optical fiber link 1109 within the optical network 1101. In some embodiments, the second portion of the optical fiber array 807 of the second computing module instance 800-2 is one-third of the optical fibers within the optical fiber array 807. A second end of the optical fiber link 1109 is connected to a second portion of the optical fiber array 709 of the second DRAM module instance 700-2. In some embodiments, the second portion of the optical fiber array 709 of the second DRAM module instance 700-2 is one-third of the optical fibers within the optical fiber array 709.

A first portion of the optical fiber array 807 of the third computing module instance 800-3 is connected to a first end of an optical fiber link 1111 within the optical network 1101. In some embodiments, the first portion of the optical fiber array 807 of the third computing module instance 800-3 is one-third of the optical fibers within the optical fiber array 807. A second end of the optical fiber link 1111 is connected to a first portion of the optical fiber array 711 of the first DRAM module instance 700-1. In some embodiments, the first portion of the optical fiber array 711 of the first DRAM module instance 700-1 is one-third of the optical fibers within the optical fiber array 711. A second portion of the optical fiber array 807 of the third computing module instance 800-3 is connected to a first end of an optical fiber link 1113 within the optical network 1101. In some embodiments, the second portion of the optical fiber array 807 of the third computing module instance 800-3 is one-third of the optical fibers within the optical fiber array 807. A second end of the optical fiber link 1113 is connected to a first portion of the optical fiber array 711 of the second DRAM module instance 700-2. In some embodiments, the first portion of the optical fiber array 711 of the second DRAM module instance 700-2 is one-third of the optical fibers within the optical fiber array 711.

A first portion of the optical fiber array 807 of the fourth computing module instance 800-4 is connected to a first end of an optical fiber link 1115 within the optical network 1101. In some embodiments, the first portion of the optical fiber array 807 of the fourth computing module instance 800-4 is one-third of the optical fibers within the optical fiber array 807. A second end of the optical fiber link 1115 is connected to a second portion of the optical fiber array 711 of the first DRAM module instance 700-1. In some embodiments, the second portion of the optical fiber array 711 of the first DRAM module instance 700-1 is one-third of the optical fibers within the optical fiber array 711. A second portion of the optical fiber array 807 of the fourth computing module instance 800-4 is connected to a first end of an optical fiber link 1117 within the optical network 1101. In some embodiments, the second portion of the optical fiber array 807 of the fourth computing module instance 800-4 is one-third of the optical fibers within the optical fiber array 807. A second end of the optical fiber link 1117 is connected to a second portion of the optical fiber array 711 of the second DRAM module instance 700-2. In some embodiments, the second portion of the optical fiber array 711 of the second DRAM module instance 700-2 is one-third of the optical fibers within the optical fiber array 711.

The optical connectivity between the four instances of the computing device 800-1 through 800-4 and the two instances of the DRAM modules 700-1 and 700-2 enables any of the processors 803-1 through 803-N in any of the four instances of the computing device 800-1 through 800-4 to perform over-optical input/output operations with any of the DRAM DIMM's 713-1 through 713-10 in any of the two instances of the DRAM modules 700-1 and 700-2. And, in some embodiments, the above-mentioned over-optical input/output operations are performed using the CXL protocol. In this manner, the TeraPHY chiplets 503A on the four computing device instances 800-1 through 800-4 and the TeraPHY chiplets 503-1 and 503-2 on each of the two DRAM module instances 700-1 and 700-2 provide each of the processors 803-1 through 803-N of the four instances of the computing device 800-1 through 800-4 with over-optical I/O access to a large pooled DRAM system that is collectively implemented within the multiple DRAM modules 700-1 and 700-2. In some embodiments, with each DRAM module 700-1 and 700-2 providing a data rate of up to 4.096 Tbps, as described with regard to FIG. 16, the optical data communication system 1100 provides each of the processors 803-1 through 803-N of the four instances of the computing device 800-1 through 800-4 with an over-optical I/O access data rate of up to 4.096 Tbps using the CXL protocol. Also, the optical data communication system 1100 enables a total memory capacity corresponding to the combination of the ten DRAM DIMM's 713-1 through 713-10 in both of the DRAM module instances 700-1 and 700-2 to be accessible over-optical using the CXL protocol by each of the processors 803-1 through 803-N of the four instances of the computing device 800-1 through 800-4.

In various embodiments, each of the optical links 1103, 1105, 1107, 1109, 1111, 1113, 1115, and 1117 can include optical fibers, optical fiber arrays, optical waveguides, light wave circuits, and any number and type of active and/or passive optical devices, such as optical splitters, optical combiners, optical amplifiers, among others. In some embodiments, each I/O Hub 805 of the four instances of the computing device 800-1 through 800-4 and each of the CXL Hub/FO 701 of the two instances of the DRAM modules 700-1 and 700-2 is configured to implement the CXL protocol. Therefore, the example optical data communication system 1100 uses the CXL protocol between a remote pooled DRAM system spread across multiple DRAM module instances 700-1, 700-2 and multiple computing device instances 800-1 through 800-4. Also, the optical data communication system 1100 is scalable. In some embodiments, the optical data communication system 1100 is extended to include more DRAM modules than just the two DRAM module instances 700-1 and 700-2 and/or more computing devices than just the four computing device instances 800-1 through 800-4. Also, in some embodiments, the optical data communication system 1100 includes multiple types of DRAM modules. For example, in some embodiments, the optical data communication system 1100 includes a combination of the example DRAM modules 500, 600, and 700, as described with regard to FIGS. 14, 15, and 16, respectively. Similarly, in some embodiments, the optical data communication system 1100 includes multiple types of computing devices. For example, in some embodiments, the optical data communication system 1100 includes a combination of the example computing devices 800 and 900, as described with regard to FIGS. 17 and 18, respectively. Therefore, it should be understood that the optical data communication system 1100 of FIG. 20 is provided by way of example and represents one of essentially any number and type of optical data communication system configurations in which the TeraPHY chiplet technology is leveraged to provide for bi-directional over-optical I/O data communication between a remote memory system (e.g., pooled DRAM system) and multiple processing devices, using advanced data communication protocols, such as the CXL protocol.

Various embodiments are disclosed herein for a computer memory system that includes an electro-optical chip (e.g., TeraPHY chiplet 503, 503-1, 503-2, etc.), an electrical fanout chip (e.g., CXL Hub/FO (fanout) chip 501, 701, etc.), and at least one DIMM slot electrically connected to the electrical fanout chip. Each of the at least one DIMM slot is configured to receive a corresponding DRAM DIMM. The electro-optical chip includes an electrical interface and a photonic interface. The photonic interface is configured to optically connect with an optical link. In some embodiments, the optical link is an optical fiber array. The electrical fanout chip is electrically connected to the electrical interface of the electro-optical chip. The electrical fanout chip is configured to direct bi-directional electrical data communication between the electro-optical chip and each DRAM DIMM corresponding to the at least one DIMM slot. The electro-optical chip includes at least one optical macro. Each of the at least one optical macro is configured to convert outgoing electrical data signals received through the electrical interface of the electro-optical chip into outgoing optical data signals. Each of the at least one optical macro is configured to transmit the outgoing optical data signals through the photonic interface of the electro-optical chip to the optical link. Each of the at least one optical macro is configured to convert incoming optical data signals received through the photonic interface of the electro-optical chip from the optical link into incoming electrical data signals. Each of the at least one optical macro is configured to transmit the incoming electrical data signals through the electrical interface of the electro-optical chip.

In some embodiments, the electro-optical chip and the electrical fanout chip are flip-chip connected to a substrate that includes electrically conductive routings, such that the electro-optical chip and the electrical fanout chip are electrically connected to each other through some of the electrically conductive routings within the substrate. In some embodiments, the substrate and the at least one DIMM slot are attached to a same module board. In some embodiments, the electrically conductive routings within the substrate are included within a redistribution layer structure formed within the substrate. In some embodiments, the computer memory system includes a plurality of DIMM slots, with the electrical fanout chip being electrically connected to each of the plurality of DIMM slots. In some embodiments, the electrical fanout chip is configured to implement the CXL interconnection protocol for data communication between a computer processor and each DRAM DIMM that is installed in the at least one DIMM slot of the computer memory system.

In some embodiments, each of the at least one optical macro of the electro-optical chip includes a plurality of transmitter slices and a plurality of receiver slices. Each transmitter slice of the plurality of transmitter slices includes a first corresponding optical microring resonator configured to modulate continuous wave light to convert the outgoing electrical data signals received through the electrical interface of the electro-optical chip from the electrical fanout chip into the outgoing optical data signals. Each receiver slice of the plurality of receiver slices includes a second corresponding optical microring resonator configured to optically couple the incoming optical data signals received through the photonic interface of the electro-optical chip from the optical link. In some embodiments, the first corresponding optical microring resonator is configured to operate at a specified optical wavelength to modulate continuous wave light having the specified optical wavelength to convert the outgoing electrical data signals into the outgoing optical data signals having the specified optical wavelength, and the second corresponding optical microring resonator is configured to operate at the specified optical wavelength to optically couple the incoming optical data signals having the specified optical wavelength. An optical power supply (e.g., optical power supply 502) is optically connected to the electro-optic chip. The optical power supply is configured to generate continuous wave light and supply the continuous wave light to the plurality of transmitter slices of the at least one optical macro within the electro-optical chip.

In some embodiments, the computer memory system includes a plurality of electro-optical chips, where each electro-optical chip of the plurality of electro-optical chips includes a respective electrical interface and a respective photonic interface. Each respective photonic interface of the plurality of electro-optical chips is configured to optically connect with a respective optical link. Each electro-optical chip of the plurality of electro-optical chips includes at least one respective optical macro. Each of the at least one respective optical macro is configured to convert outgoing electrical data signals received through the electrical interface of the respective electro-optical chip from the electrical fanout chip into outgoing optical data signals. Each of the at least one respective optical macro is also configured to transmit the outgoing optical data signals through the photonic interface of the respective electro-optical chip to the respective optical link. Each of the at least one respective optical macro is also configured to convert incoming optical data signals received through the photonic interface of the respective electro-optical chip from the respective optical link into incoming electrical data signals. Each of the at least one respective optical macro is also configured to transmit the incoming electrical data signals through the electrical interface of the respective electro-optical chip to the electrical fanout chip. In some embodiments, the plurality of electro-optical chips and the electrical fanout chip are attached to a same module board. In some embodiments, the optical power supply is optically connected to each of the plurality of electro-optic chips, where the optical power supply is configured to generate continuous wave light and supply the continuous wave light to each optical macro within each of the plurality of electro-optical chips.

In some embodiments, a first end of the optical link is optically connected to the electro-optical chip of the computer memory system and a second end of the optical link is optically connected to a second electro-optical chip (e.g., TeraPHY chiplet 503A, 503B, 503C, etc.). The second electro-optical chip includes a corresponding electrical interface electrically connected to an integrated circuit chip (e.g., CPU 803-1-803-N by way of I/O Hub 805, GPU/TPU 905, etc.). The second electro-optical chip also includes a corresponding photonic interface optically connected to the second end of the optical link. The second electro-optical chip includes at least one optical macro. Each of the at least one optical macro of the second electro-optical chip is configured to convert outgoing electrical data signals received through the corresponding electrical interface of the second electro-optical chip from the integrated circuit chip into outgoing optical data signals. Each of the at least one optical macro of the second electro-optical chip is also configured to transmit the outgoing optical data signals through the corresponding photonic interface of the second electro-optical chip to the optical link. Each of the at least one optical macro of the second electro-optical chip is also configured to convert incoming optical data signals received through the corresponding photonic interface of the second electro-optical chip from the optical link into incoming electrical data signals. Each of the at least one optical macro of the second electro-optical chip is also configured to transmit the incoming electrical data signals through the corresponding electrical interface of the second electro-optical chip to the integrated circuit chip.

FIG. 21 shows a flowchart of a method for operating a computer memory system, in accordance with some embodiments. The method includes an operation 2101 for receiving a first set of optical data signals through an optical link, where the first set of optical data signals conveys instructions for a memory access operation. The method also includes an operation 2103 for generating a first set of electrical data signals based on the first set of optical data signals. The first set of electrical data signals conveys the instructions for the memory access operation. The method also includes an operation 2105 for transmitting the first set of electrical data signals to an electrical fanout chip connected to a memory device. In some embodiments, the memory device is a DRAM DIMM. The method also includes an operation 2107 for operating the electrical fanout chip to perform the memory access operation on the memory device in accordance with the first set of electrical data signals, where performance of the memory access operation generates a second set of electrical data signals conveying results of the memory access operation. In some embodiments, the electrical fanout chip operates to the CXL interconnection protocol for data communication between a computer processor and the DRAM DIMM of the memory device. The method also includes an operation 2109 for generating a second set of optical data signals from the second set of electrical data signals, where the second set of optical data signals conveys the results of the memory access operation. The method also includes an operation 2111 for transmitting the second set of optical data signals through the optical link.

In some embodiments, the operations 2101, 2103, 2105, 2109, and 2111 are performed by an electro-optical chip (e.g., TeraPHY chiplet 503, 503-1, 503-2, etc.). In some embodiments, generating the first set of electrical data signals in operation 2103 includes operating at least one optical microring resonator of a plurality of optical microring resonators on the electro-optical chip to optically couple the first set of optical data signals received through the optical link in the operation 2101 and convey the first set of optically coupled optical data signals to a photodetector device electrically connected to de-modulation circuitry on the electro-optical chip. The method also includes operating the de-modulation circuitry to generate the first set of electrical data signals based on the first set of optical data signals as conveyed to the photodetector device. In some embodiments, generating the second set of optical data signals in the operation 2109 includes operating at least one optical microring resonator of a plurality of optical microring resonators on the electro-optical chip to modulate continuous wave light having a specified optical wavelength to convert the second set of electrical data signals into the second set of optical data signals having the specified optical wavelength.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the invention description. Accordingly, the present embodiments are to be considered as illustrative and not restrictive, and the invention is not to be limited to the details given herein, but may be modified within the scope and equivalents of the described embodiments.

What is claimed is:

1. A computer memory system, comprising:
   a first optical fiber link;
   a first electro-optical chip in optical data communication with the first optical fiber link, the first electro-optical chip including at least one optical macro configured to convert incoming optical data signals received from the first optical fiber link into corresponding incoming electrical data signals and configured to convert outgoing electrical data signals into corresponding outgoing optical data signals conveyed through the first optical fiber link;
   a second optical fiber link;
   a second electro-optical chip in optical data communication with the second optical fiber link, the second electro-optical chip including at least one optical macro configured to convert incoming optical data signals received from the second optical fiber link into corresponding incoming electrical data signals and configured to convert outgoing electrical data signals into corresponding outgoing optical data signals conveyed through the second optical fiber link;
   an electrical fanout chip in bi-directional electrical data communication with each of the first electro-optical chip and the second electro-optical chip, the electrical fanout chip electrically connected to receive the incoming electrical data signals from the at least one optical macro of the first electro-optical chip, the electrical fanout chip also electrically connected to receive the incoming electrical data signals from the at least one optical macro of the second electro-optical chip; and a plurality of memory modules, each of the plurality of memory modules in bi-directional electrical data communication with the electrical fanout chip.

2. The computer memory system as recited in claim 1, further comprising:

a first optical fiber array disposed to optically connect the first electro-optical chip with the first optical fiber link; and a second optical fiber array disposed to optically connect the second electro-optical chip with the second optical fiber link.

3. The computer memory system as recited in claim 1, wherein each of the plurality of memory modules is a dynamic random access memory dual in-line memory module.

4. The computer memory system as recited in claim 1, wherein the first electro-optical chip, the second electro-optical chip, and the electrical fanout chip are implemented together with a multi-chip package.

5. The computer memory system as recited in claim 4, wherein the multi-chip package and the plurality of memory modules are implemented together one a module board.

6. The computer memory system as recited in claim 4, wherein the multi-chip package includes a redistribution layer, wherein the first electro-optical chip is electrically connected to the electrical fanout chip through the redistribution layer, and wherein the second electro-optical chip is electrically connected to the electrical fanout chip through the redistribution layer.

7. The computer memory system as recited in claim 4, wherein each of the plurality of memory modules is electrically connected to the electrical fanout chip through the redistribution layer.

8. The computer memory system as recited in claim 4, wherein each of the first electro-optical chip, the second electro-optical chip, and the electrical fanout chip is flip-chip connected to the multi-chip package.

9. The computer memory system as recited in claim 1, wherein each of the plurality of memory modules is a memory stack.

10. The computer memory system as recited in claim 1, wherein each of the plurality of memory modules is either a dynamic random access memory dual in-line memory module or a memory stack.

11. The computer memory system as recited in claim 1, wherein the plurality of memory modules is ten memory modules.

12. The computer memory system as recited in claim 1, wherein the at least one optical macro includes a transmitter slice that includes an optical microring resonator configured to modulate light signals of a particular wavelength in accordance with electrical data signals, and wherein the at least one optical macro includes a receiver slice that includes another optical microring resonator configured to optically in-couple light signals of another particular wavelength.

13. The computer memory system as recited in claim 1, further comprising:

an optical power supply configured to generate continuous wave laser light of one or more specified wavelengths, the optical power supply optically connected to each of the first electro-optical chip and the second electro-optical chip.

14. The computer memory system as recited in claim 13, further comprising:

a first optical waveguide configured to optically connect the optical power supply to the first electro-optical chip; and a second optical waveguide configured to optically connect the optical power supply to the second electro-optical chip.

15. The computer memory system as recited in claim 14, wherein the first optical waveguide is optically connected to a first transmitter slice within the first electro-optical chip, the first transmitter slice including a first optical microring resonator configured to modulate light signals of a first specified wavelength in accordance with electrical data signals, wherein the second optical waveguide is optically connected to a second transmitter slice within the second electro-optical chip, the second transmitter slice including a second optical microring resonator configured to modulate light signals of a second specified wavelength in accordance with electrical data signals.

16. A method for operating a computer memory system, comprising:

receiving a first optical data signal over a first optical link, the first optical data signal providing instructions for a first computer memory operation;

processing the first optical data signal through a first electro-optical chip to demodulate the first optical data signal into a first electrical data signal;

conveying the first electrical data signal through an electrical fanout chip to perform the first computer memory operation;

receiving a second optical data signal over a second optical link, the second optical data signal providing instructions for a second computer memory operation;

processing the second optical data signal through a second electro-optical chip to demodulate the second optical data signal into a second electrical data signal, wherein the second electro-optical chip is configured in a same manner as the first electro-optical chip, wherein the second electro-optical chip operates independently from the first electro-optical chip; and conveying the second electrical data signal through the electrical fanout chip to perform the second computer memory operation, wherein conveying the second electrical data signal through the electrical fanout chip is done independently from conveying the first electrical data signal through the electrical fanout chip.

17. The method as recited in claim 16, wherein the first optical data signal and the second optical data signal are received and processed at a same time.

18. The method as recited in claim 16, wherein the first electrical data signal and the second electrical data signal are conveyed through the electrical fanout chip at a same time.

19. The method as recited in claim 16, further comprising:

receiving a first set of retrieved data at the first electro-optical chip from the electrical fanout chip;

operating the first electro-optical chip to modulate continuous wave laser light to generate a third optical data signal that conveys the first set of retrieved data;

transmitting the third optical data signal from the first electro-optical chip over the first optical link;

receiving a second set of retrieved data at the second electro-optical chip from the electrical fanout chip;

operating the second electro-optical chip to modulate
   continuous wave laser light to generate a fourth optical
   data signal that conveys the second set of retrieved
   data; and
transmitting the fourth optical data signal from the second
   electro-optical chip over the second optical link.

20. The method as recited in claim 19, wherein one or
more of receiving the second set of retrieved data at the
second electro-optical chip, operating the second electro-
optical chip to modulate continuous wave laser light, and
transmitting the fourth optical data signal from the second
electro-optical chip is done at a same time as one or more of
receiving the first set of retrieved data at the first electro-
optical chip, operating the first electro-optical chip to modu-
late continuous wave laser light, and transmitting the third
optical data signal from the first electro-optical chip.

* * * * *